US009728547B1

(12) United States Patent
Ohsaki et al.

(10) Patent No.: US 9,728,547 B1
(45) Date of Patent: Aug. 8, 2017

(54) THREE-DIMENSIONAL MEMORY DEVICE WITH ALUMINUM-CONTAINING ETCH STOP LAYER FOR BACKSIDE CONTACT STRUCTURE AND METHOD OF MAKING THEREOF

(71) Applicant: SANDISK TECHNOLOGIES LLC, Plano, TX (US)

(72) Inventors: Shingo Ohsaki, Yokkaichi (JP); Hiroshi Kariya, Yokkaichi (JP); Takuro Maede, Yokkaichi (JP); Takeshi Kawamura, Yokkaichi (JP)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/159,034

(22) Filed: May 19, 2016

(51) Int. Cl.
*H01L 29/792* (2006.01)
*H01L 27/11556* (2017.01)
(Continued)

(52) U.S. Cl.
CPC .... *H01L 27/11556* (2013.01); *H01L 21/0228* (2013.01); *H01L 21/02178* (2013.01); *H01L 21/02227* (2013.01); *H01L 21/31144* (2013.01); *H01L 21/32139* (2013.01); *H01L 21/76805* (2013.01); *H01L 21/76831* (2013.01); *H01L 27/1157* (2013.01); *H01L 27/11563* (2013.01); *H01L 27/11578* (2013.01);
(Continued)

(58) Field of Classification Search
CPC .......... H01L 27/11563; H01L 27/1157; H01L 27/11578; H01L 27/11583

USPC ................................................... 257/314, 324
See application file for complete search history.

(56) References Cited

U.S. PATENT DOCUMENTS 5,915,167 A 6/1999 Leedy
7,005,350 B2 2/2006 Walker et al.
(Continued)

FOREIGN PATENT DOCUMENTS

JP 2008047822 A 2/2008
WO WO02/15277 A2 2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Matthew E Warren
(74) *Attorney, Agent, or Firm* — The Marbury Law Group PLLC

(57) ABSTRACT

Unwanted erosion of dielectric materials around a backside contact trench can be avoided or minimized employing an aluminum oxide liner. An aluminum oxide liner can be formed inside an insulating material layer in a backside contact trench to prevent collateral etching of the insulating material at an upper portion of the backside contact trench during an anisotropic etch that forms an insulating spacer. Alternatively, an aluminum oxide layer can be employed as a backside blocking dielectric layer. An upper portion of the aluminum oxide layer can be converted into an aluminum compound layer including aluminum and a non-metallic element other than oxygen at an upper portion of the trench, and can be employed as a protective layer during formation of a backside contact structure.

11 Claims, 34 Drawing Sheets

(51) Int. Cl.
*H01L 21/02* (2006.01)
*H01L 21/311* (2006.01)
*H01L 21/768* (2006.01)
*H01L 27/11582* (2017.01)
*H01L 21/3213* (2006.01)
*H01L 27/11563* (2017.01)
*H01L 27/11578* (2017.01)
*H01L 27/1157* (2017.01)
*H01L 27/11565* (2017.01)
*H01L 27/11519* (2017.01)

(52) U.S. Cl.
CPC ... *H01L 27/11582* (2013.01); *H01L 27/11519* (2013.01); *H01L 27/11565* (2013.01)

(56) References Cited

U.S. PATENT DOCUMENTS

| | | | |
|---|---|---|---|
| 7,023,739 B2 | 4/2006 | Chen et al. | |
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,187,936 B2 | 5/2012 | Alsmeier et al. | |
| 8,394,716 B2 | 3/2013 | Hwang et al. | |
| 8,455,940 B2 * | 6/2013 | Lee | H01L 27/11565 257/288 |
| 9,023,719 B2 | 5/2015 | Pachamuthu et al. | |
| 9,230,984 B1 | 1/2016 | Takeguchi | |
| 9,236,396 B1 | 1/2016 | Koka et al. | |
| 2007/0210338 A1 | 9/2007 | Orlowski | |
| 2007/0252201 A1 | 11/2007 | Kito et al. | |
| 2008/0116583 A1 | 5/2008 | Yuki | |
| 2009/0230449 A1 | 9/2009 | Sakaguchi et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0151667 A1 | 6/2011 | Hwang et al. | |
| 2011/0266606 A1 | 11/2011 | Park et al. | |
| 2012/0001247 A1 | 1/2012 | Alsmeier | |
| 2012/0001249 A1 | 1/2012 | Alsmeier | |
| 2012/0001250 A1 | 1/2012 | Alsmeier | |
| 2012/0012920 A1 | 1/2012 | Shin et al. | |
| 2012/0119287 A1 | 5/2012 | Park et al. | |
| 2013/0126957 A1 | 5/2013 | Higashitani et al. | |
| 2013/0264631 A1 | 10/2013 | Alsmeier et al. | |
| 2014/0339621 A1 * | 11/2014 | Simsek-Ege | H01L 29/66825 257/316 |
| 2015/0076584 A1 | 3/2015 | Pachamuthu et al. | |
| 2016/0218059 A1 * | 7/2016 | Nakada | H01L 27/11556 |
| 2016/0276353 A1 * | 9/2016 | Kobayashi | H01L 27/11582 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

Office Communication Concerning Corresponding U.S. Appl. No. 14/501,539, filed Sep. 30, 2014, (19 pages).

U.S. Appl. No. 14/462,209, filed Aug. 14, 2014, SanDisk Technologies Inc.

U.S. Appl. No. 14/468,743, filed Aug. 26, 2014, SanDisk Technologies Inc.

U.S. Appl. No. 14/491,026, filed Sep. 19, 2014, SanDisk Technologies Inc.

U.S. Appl. No. 14/491,315, filed Sep. 19, 2014, SanDisk Technologies Inc.

U.S. Appl. No. 14/517,134, filed Oct. 17, 2014, SanDisk Technologies Inc.

U.S. Appl. No. 14/539,372, filed Dec. 11, 2014, SanDisk Technologies Inc.

U.S. Appl. No. 14/540,479, filed Nov. 13, 2014, SanDisk Technologies Inc.

U.S. Appl. No. 14/602,491, filed Jan. 22, 2015, SanDisk Technologies Inc.

U.S. Appl. No. 14/723,919, filed May 28, 2015, SanDisk Technologies Inc.

U.S. Appl. No. 14/748,871, filed Jun. 24, 2015, SanDisk Technologies Inc.

U.S. Appl. No. 14/922,516, filed Oct. 26, 2015, SanDisk Technologies Inc.

U.S. Appl. No. 14/925,171, filed Oct. 28, 2015, SanDisk Technologies Inc.

U.S. Appl. No. 15/012,124, filed Feb. 1, 2016, SanDisk Technologies Inc.

* cited by examiner

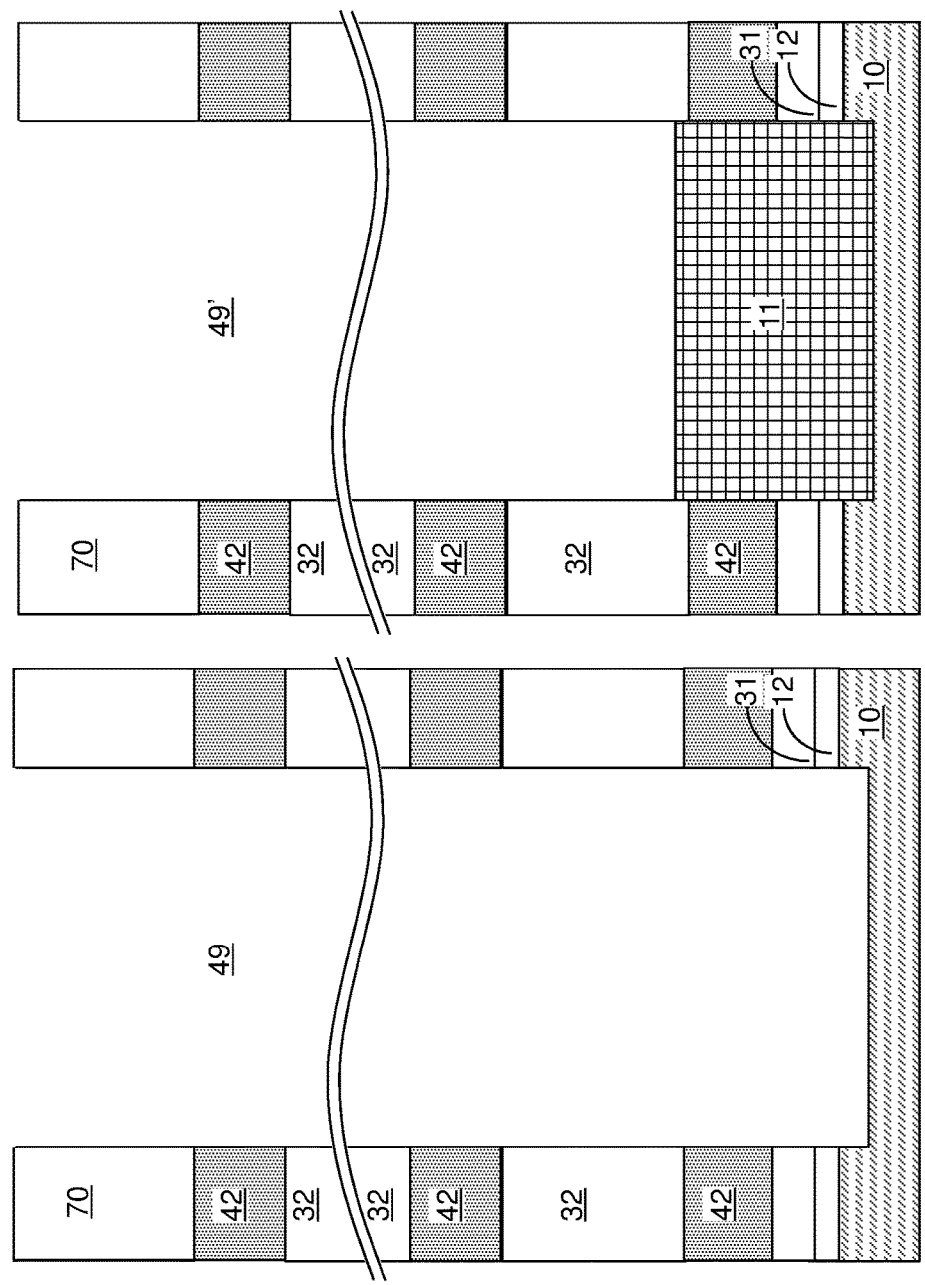

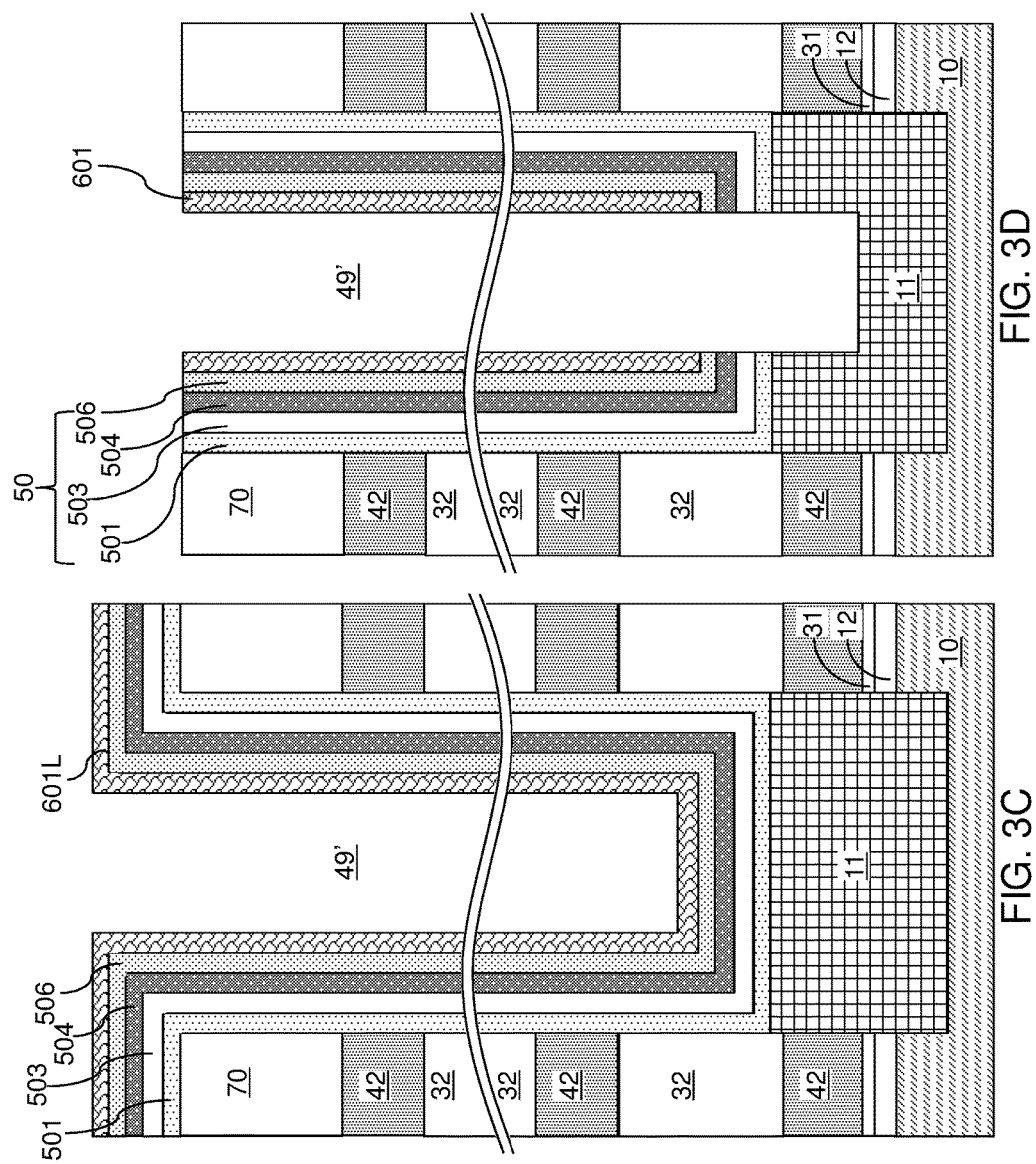

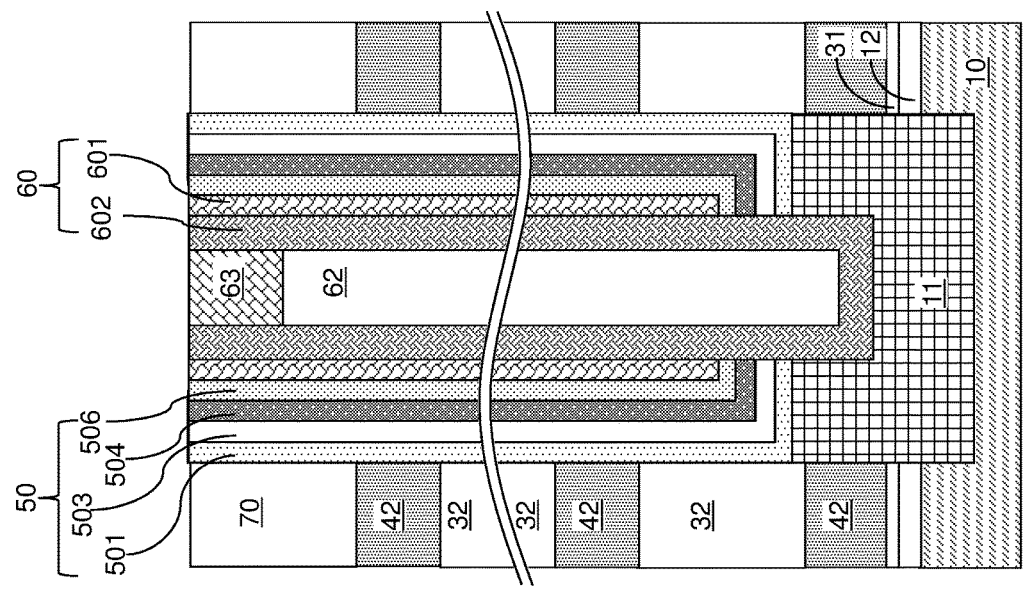
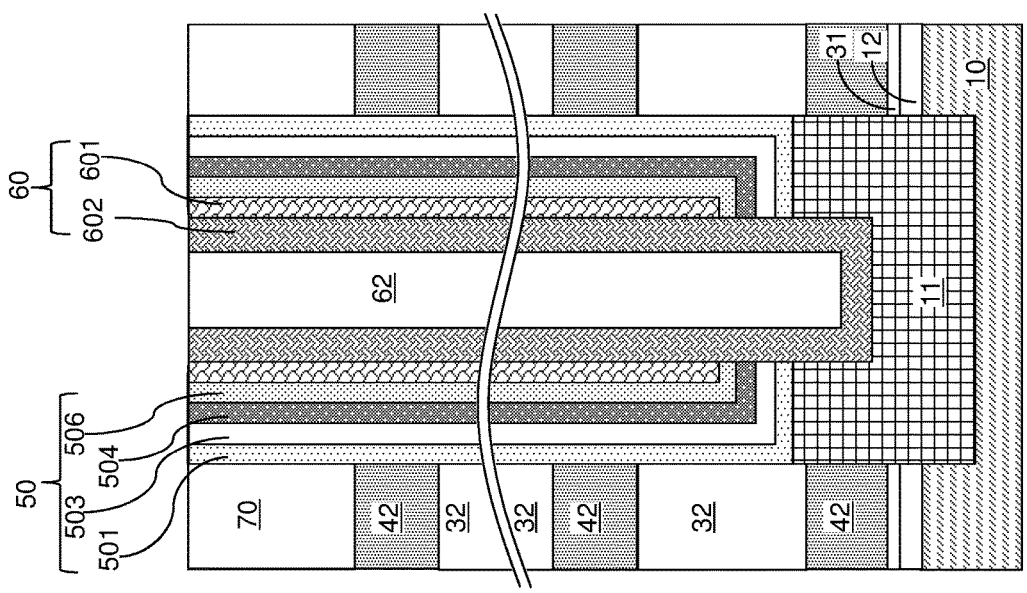

THREE-DIMENSIONAL MEMORY DEVICE WITH ALUMINUM-CONTAINING ETCH STOP LAYER FOR BACKSIDE CONTACT STRUCTURE AND METHOD OF MAKING THEREOF

FIELD

The present disclosure relates generally to the field of three-dimensional memory devices and specifically to three-dimensional memory devices including an aluminum containing etch stop layer and methods of making thereof.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises an alternating stack of insulating layers and electrically conductive layers located over a substrate; a trench extending through the alternating stack; an aluminum oxide backside blocking dielectric layer including liner portions located between the electrically conductive layers and the insulating layers and a vertical portion located at a periphery of the trench; an annular aluminum compound portion located at an upper portion of the trench and comprising aluminum and a non-metallic element other than oxygen; and a contact via structure located inside the vertical portion of the aluminum oxide backside blocking dielectric layer and the annular aluminum compound portion and contacting a portion of the substrate.

According to another aspect of the present disclosure, a method of forming a device structure is provided. A stack of alternating layers comprising insulating layers and sacrificial material layers is formed over a substrate. A trench is formed through the stack of alternating layers. Backside recesses are formed by removing the sacrificial material layers selective to the insulating layers. An aluminum oxide backside blocking dielectric layer is formed in the backside recesses, on a sidewall of the trench, and over the stack of alternating layers. An upper portion of the aluminum oxide backside blocking dielectric layer is converted into an aluminum compound layer including aluminum and a non-metallic element other than oxygen. A contact via structure is formed inside a remaining volume of the trench, wherein the contact via structure is laterally surrounded by remaining portion of the aluminum oxide backside blocking dielectric layer and a vertical portion of the aluminum compound layer.

According to yet another aspect of the present disclosure, a three-dimensional memory device is provided, which comprises an alternating stack of insulating layers and electrically conductive layers located over a substrate; a plurality of memory stack structures extending through the alternating stack, wherein each of the plurality of memory stack structures comprises a memory film and a semiconductor channel that is laterally surrounded by the memory film; a trench extending through the alternating stack; an insulating spacer comprising a dielectric material selected from silicon oxide and silicon nitride and located at a periphery of the trench; an aluminum oxide liner located inside the insulating spacer; and a contact via structure located inside the aluminum oxide liner and contacting a portion of the substrate.

According to still another aspect of the present disclosure, a method of forming a device structure is provided. A stack of alternating layers comprising insulating layers and sacrificial material layers is formed over a substrate. A trench is formed through the stack of alternating layers. Backside recesses are formed by removing the sacrificial material layers selective to the insulating layers. Electrically conductive layers in the backside recesses. An insulating material layer is formed in the trench and over the stack of alternating layers. An aluminum oxide liner is formed over the insulating material layer. The aluminum oxide liner and the insulating material layer are anisotropically etched. A remaining portion of the aluminum oxide liner constitutes an aluminum oxide liner, and a remaining portion of the insulating material layer constitutes an insulating spacer that laterally surrounds the aluminum oxide liner. A contact via structure is formed inside the aluminum oxide liner and on a physically exposed surface of the substrate underneath the trench.

According to even another aspect of the present disclosure, a three-dimensional memory device is provided, which comprises an alternating stack of insulating layers and electrically conductive layers located over a substrate; a plurality of memory stack structures extending through the alternating stack, wherein each of the plurality of memory stack structures comprises a memory film and a semiconductor channel that is laterally surrounded by the memory film; a trench extending through the alternating stack; a backside blocking dielectric layer located between the electrically conductive layers and the plurality of memory stack structures, between each vertically neighboring pairs of an electrically conductive layer and an insulating layer in the alternating stack, and on a sidewall of the trench; an aluminum oxide liner contacting portions of the backside blocking dielectric layer overlying the sidewalls of the trench, and contacting sidewalls of the electrically conductive layers; an insulating spacer comprising a dielectric material and located inside the aluminum oxide liner; and a contact via structure located inside the insulating spacer and contacting a portion of the substrate.

According to a further aspect of the present disclosure, a method of forming a device structure is provided. A stack of alternating layers comprising insulating layers and sacrificial material layers is formed over a substrate. A trench is formed through the stack of alternating layers. Backside recesses are formed by removing the sacrificial material layers selective to the insulating layers. A backside blocking dielectric layer is formed in the backside recesses and on a sidewall of the trench. Electrically conductive layers are formed in the backside recesses. An aluminum oxide liner layer is formed on sidewalls of the electrically conductive layers. The method further comprises anisotropically etching the aluminum oxide liner layer and the backside blocking dielectric layer such that a remaining portion the aluminum oxide liner layer constitutes an aluminum oxide liner, and forming an insulating material layer on the aluminum oxide liner, and anisotropically etching the insulating material layer, such that a remaining portion of the insulating material layer constitutes an insulating spacer which is surrounded by the aluminum oxide liner. A contact via structure is formed inside the insulating spacer and on a physically exposed surface of the substrate underneath the trench.

BRIEF DESCRIPTION OF THE DRAWINGS

FIGS. 3A-3H are sequential vertical cross-sectional views of a memory opening within the first exemplary structure during various processing steps employed to form a memory stack structure according to the first embodiment of the present disclosure.

DETAILED DESCRIPTION

Figure 1:
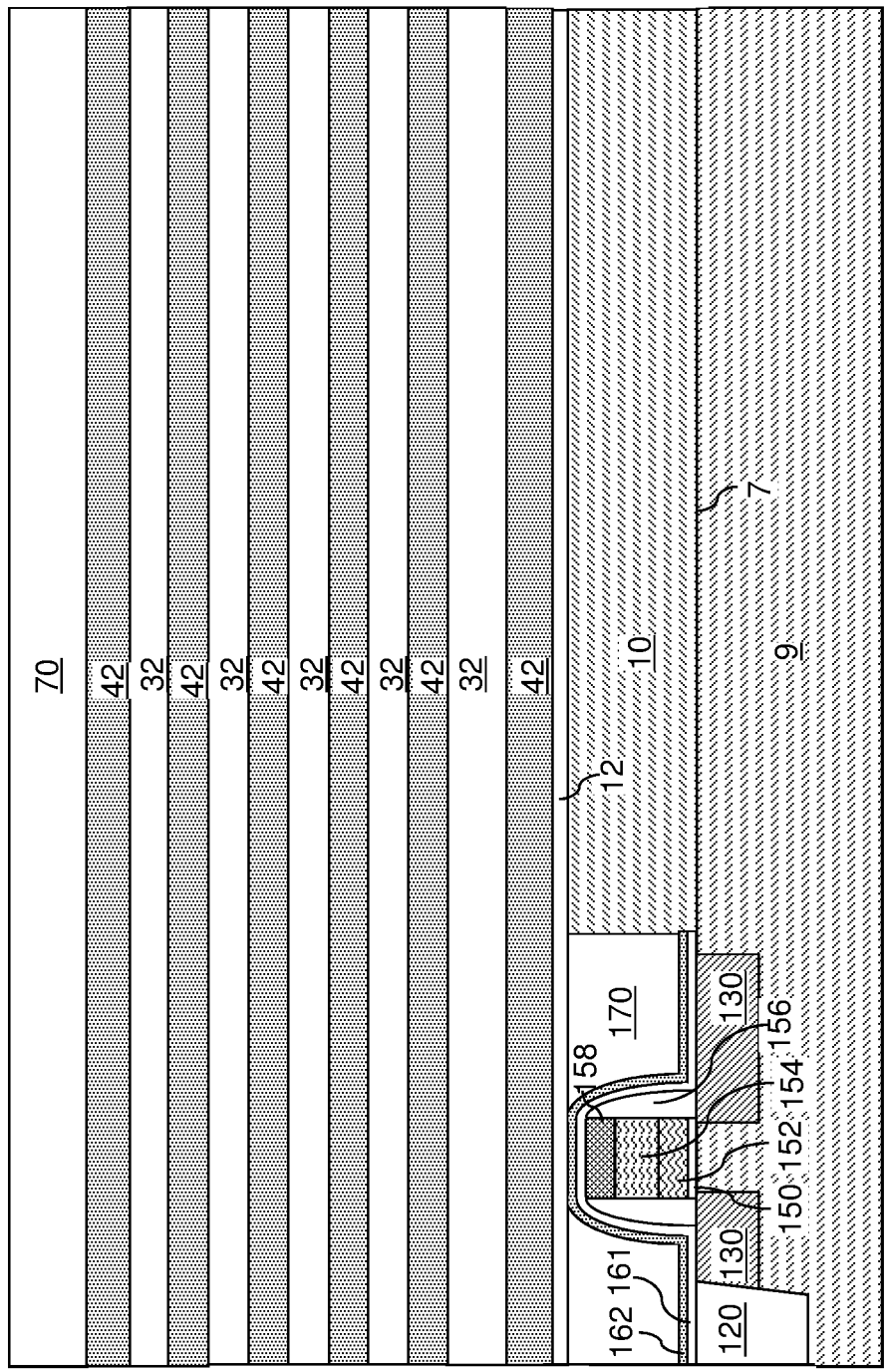
FIG. 1 is a vertical cross-sectional view of a first exemplary structure after formation of a stack including an alternating plurality of material layers according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconductor material" refers to a material having electrical conductivity in the range from $1.0 \times 10^{-6}$ S/cm to $1.0 \times 10^5$ S/cm, and is capable of producing a doped material having electrical conductivity in a range from 1.0 S/cm to $1.0 \times 10^5$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^5$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (e.g., a p-type well, not expressly shown) can be formed within the substrate semiconductor layer 9 and/or the semiconductor material layer 10 located over the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

Optionally, a gate dielectric layer 12 can be formed above the semiconductor material layer 10 and the planarization dielectric layer 170. The gate dielectric layer 12 can be, for example, silicon oxide layer. The thickness of the gate dielectric layer 12 can be in a range from 3 nm to 30 nm, although lesser and greater thicknesses can also be employed.

A stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 2:
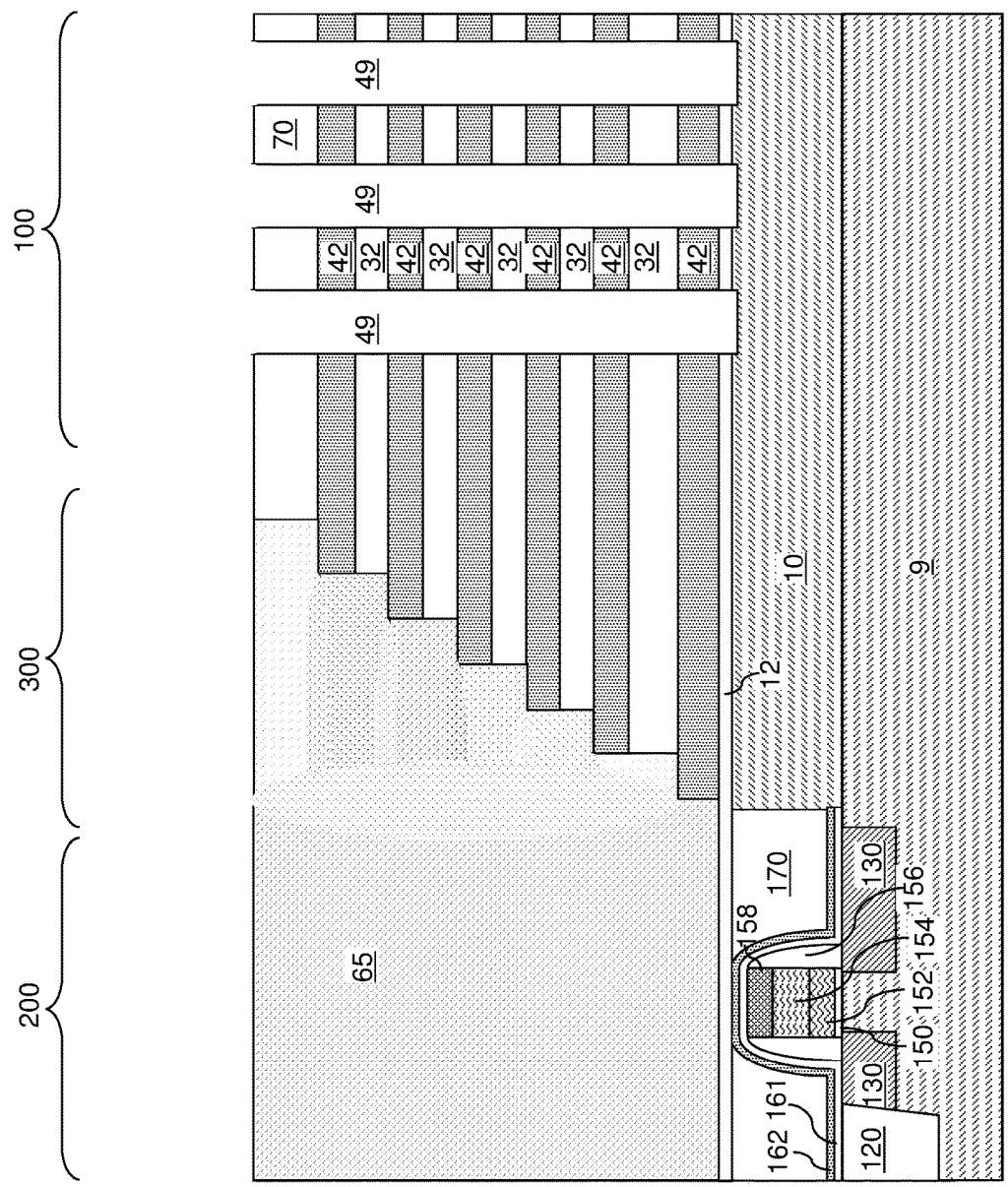
FIG. 2 is a vertical cross-sectional view of the first exemplary structure after formation of a retro-stepped dielectric material portion and memory openings extending through the stack according to the first embodiment of the present disclosure.

Referring to FIG. 2, a stepped cavity can be formed within the contact region 300. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

After formation of the stepped cavity, a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Subsequently, a lithographic material stack (not shown) including at least a photoresist layer can be formed over the insulating cap layer 70 and the retro-stepped dielectric material portion 65, and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 are formed through the gate dielectric layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the substrate semiconductor layer 9.

Figure 3E:
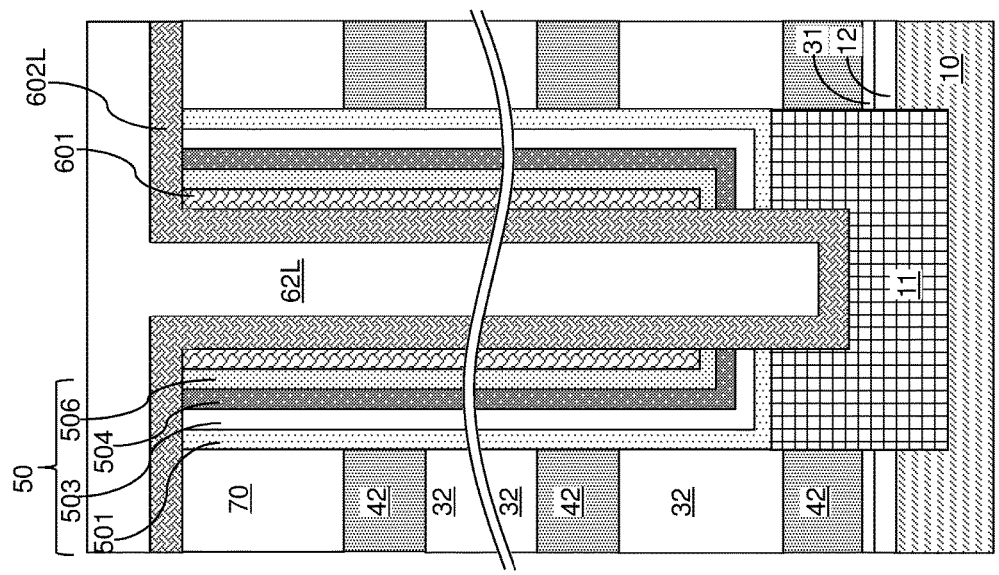

Referring to FIG. 3A, a memory opening 49 in the exemplary device structure of FIG. 2 is illustrated. The memory opening 49 extends through the insulating cap layer 70, the alternating stack (32, 42), an optional dielectric cap layer 31, such as a silicon oxide layer, the gate dielectric layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 3B, an optional epitaxial channel portion (e.g., an epitaxial pedestal) 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 3C, a stack of layers including at least one blocking dielectric layer (501, 503), a charge storage layer 504, a tunneling dielectric layer 506, and an optional first semiconductor channel layer 601L can be sequentially deposited in the memory openings 49.

The at least one blocking dielectric layer (501, 503) can include a first blocking dielectric layer 501 and a second blocking dielectric layer 503. The first blocking dielectric layer 501 includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501 can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501 can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501 can be in a range from 1 nm to 20 nm, although lesser and greater thicknesses can also be employed. The first blocking dielectric layer 501 can subsequently function as a dielectric material portion that blocks leakage of stored electrical charges to control gate electrodes. In one embodiment, the first blocking dielectric layer 501 includes aluminum oxide.

The second blocking dielectric layer 503 can be formed on the first blocking dielectric layer 501. The second blocking dielectric layer 503 can include a dielectric material that is different from the dielectric material of the first blocking dielectric layer 501. In one embodiment, the second blocking dielectric layer 503 can include silicon oxide, a dielectric metal oxide having a different composition than the first blocking dielectric layer 501, silicon oxynitride, silicon nitride, or a combination thereof. In one embodiment, the second blocking dielectric layer 503 can include silicon oxide. The second blocking dielectric layer 503 can be formed by a conformal deposition method such as low pressure chemical vapor deposition, atomic layer deposition, or a combination thereof. The thickness of the second blocking dielectric layer 503 can be in a range from 1 nm to 20 nm, although lesser and greater thicknesses can also be employed. Alternatively, the first blocking dielectric layer 501 and/or the second blocking dielectric layer 503 can be omitted, and a blocking dielectric layer can be formed after formation of backside recesses on surfaces of memory films to be subsequently formed.

Subsequently, the charge storage layer 504 can be formed. In one embodiment, the charge storage layer 504 can be a continuous layer or patterned discrete portions of a charge trapping material including a dielectric charge trapping material, which can be, for example, silicon nitride. Alternatively, the charge storage layer 504 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 504 includes a silicon nitride layer. In one embodiment, the sacrificial material layers 42 and the insulator layers 32 can have vertically coincident sidewalls, and the charge storage layer 504 can be formed as a single continuous layer. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

In another embodiment, the sacrificial material layers 42 can be laterally recessed with respect to the sidewalls of the insulator layers 32, and a combination of a deposition process and an anisotropic etch process can be employed to form the charge storage layer 504 as a plurality of memory material portions that are vertically spaced apart. While the present disclosure is described employing an embodiment in which the charge storage layer 504 is a single continuous layer, embodiments are expressly contemplated herein in which the charge storage layer 504 is replaced with a plurality of memory material portions (which can be charge trapping material portions or electrically isolated conductive material portions) that are vertically spaced apart.

The charge storage layer 504 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 504 may comprise an insulating charge trapping material, such as one or more silicon nitride segments. Alternatively, the charge storage layer 504 may comprise conductive nanoparticles such as metal nanoparticles, which can be, for example, ruthenium nanoparticles. The charge storage layer 504 can be formed, for example, by chemical vapor deposition (CVD), atomic layer deposition (ALD), physical vapor deposition (PVD), or any suitable deposition technique for storing electrical charges therein. The thickness of the charge storage layer 504 can be in a range from 2 nm to 20 nm, although lesser and greater thicknesses can also be employed.

The tunneling dielectric layer 506 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506 can include a stack of a first silicon oxide layer, a silicon oxynitride layer, and a second silicon oxide layer, which is commonly known as an ONO stack. In one embodiment, the tunneling dielectric layer 506 can include a silicon oxide layer that is substantially free of carbon or a silicon oxynitride layer that is substantially free of carbon. The thickness of the tunneling dielectric layer 506 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501, 503, 504, 506, 601L).

Referring to FIG. 3D, the optional first semiconductor channel layer 601L, the tunneling dielectric layer 506L, the charge storage layer 504, the at least one blocking dielectric layer (501, 503) are sequentially anisotropically etched employing at least one anisotropic etch process. The portions of the first semiconductor channel layer 601, the tunneling dielectric layer 506, the charge storage layer 504, and the at least one blocking dielectric layer (501, 503) located above the top surface of the insulating cap layer 70 can be removed by the at least one anisotropic etch process. Further, the horizontal portions of the first semiconductor channel layer 601L, the tunneling dielectric layer 506, the charge storage layer 504, and the at least one blocking dielectric layer (501, 503) at a bottom of each cavity 49' can be removed to form openings in remaining portions thereof. Each of the first semiconductor channel layer 601L, the tunneling dielectric layer 506, the charge storage layer 504, and the at least one blocking dielectric layer (501, 503) can be etched by anisotropic etch process.

Each remaining portion of the first semiconductor channel layer 601L constitutes a first semiconductor channel portion 601. The charge storage layer 504 can comprise a charge trapping material or a floating gate material. In one embodiment, each charge storage layer 504 can include a vertical stack of charge storage regions that store electrical charges upon programming. In one embodiment, the charge storage layer 504 can be a charge storage layer in which each portion adjacent to the sacrificial material layers 42 constitutes a charge storage region. Each remaining portion of the second blocking dielectric layer 503 is herein referred to as a second blocking dielectric layer 503. Each remaining portion of the first blocking dielectric layer 501 is herein referred to as a first blocking dielectric layer 501.

A surface of the epitaxial channel portion 11 (or a surface of the semiconductor substrate layer 10 in case the epitaxial channel portions 11 are not employed) can be physically exposed underneath the opening through the first semiconductor channel portion 601, the tunneling dielectric layer 506, the charge storage layer 504, and the at least one blocking dielectric layer (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 506 is located over the charge storage layer 504. A set of at least one blocking dielectric layer (501, 503), a charge storage layer 504, and a tunneling dielectric layer 506 in a memory opening 49 constitutes a memory film 50, which includes a plurality of charge storage regions (as embodied as the charge storage layer 504) that are insulated from surrounding materials by the at least one blocking dielectric layer (501, 503) and the tunneling dielectric layer 506.

In one embodiment, the first semiconductor channel portion 601, the tunneling dielectric layer 506, the charge storage layer 504, the second blocking dielectric layer 503, and the first blocking dielectric layer 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to 3E, a second semiconductor channel layer 602L can be deposited directly on the semiconductor surface of the epitaxial channel portion 11 or the semiconductor substrate layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Figure 3F:
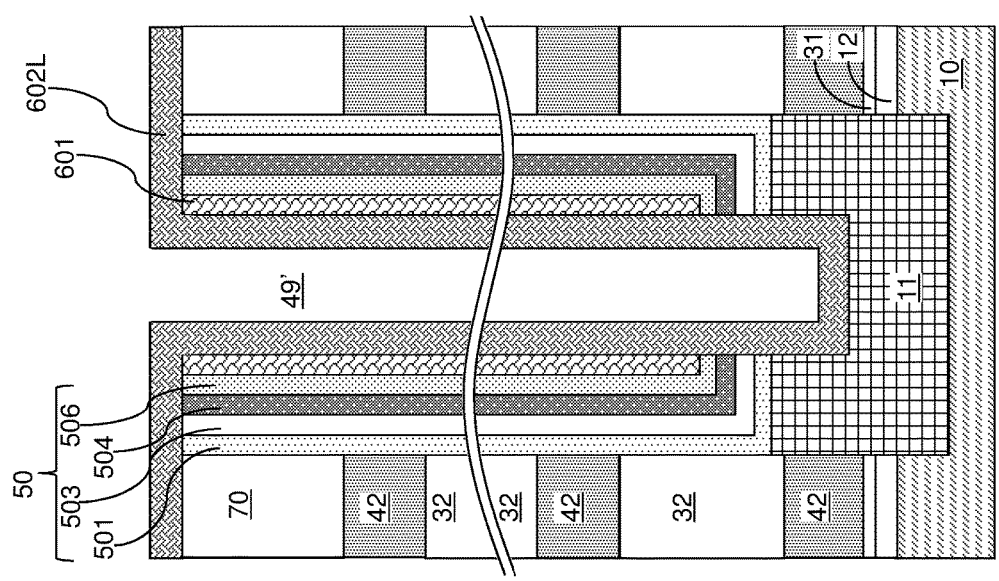

Referring to FIG. 3F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 3G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric layer 506 is surrounded by a charge storage layer 504, and laterally surrounds a portion of the semiconductor channel 60. Each adjoining set of a first blocking dielectric layer 501, a second blocking dielectric layer 503, a charge storage layer 504, and a tunneling dielectric layer 506 collectively constitute a memory film 50, which can store electrical charges with a macroscopic retention time. In some embodiments, a first blocking dielectric layer 501 and/or a second blocking dielectric layer 503 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Referring to FIG. 3H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 4:
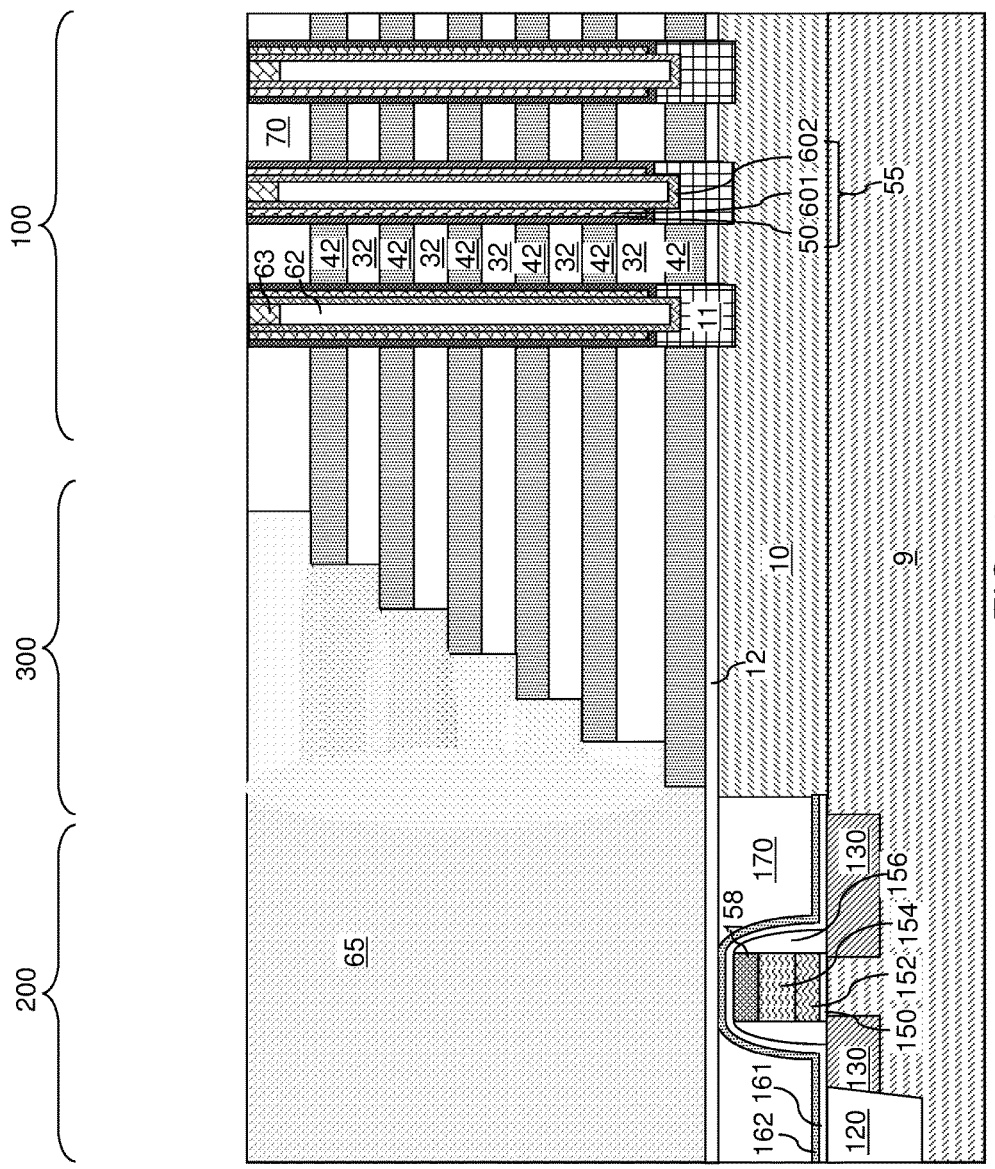
FIG. 4 is a vertical cross-sectional view of the first exemplary structure after formation of memory stack structures according to the first embodiment of the present disclosure.

The exemplary memory stack structure 55 can be embedded into the first exemplary structure illustrated in FIG. 2. FIG. 4 illustrates the first exemplary structure that incorporates multiple instances of the exemplary memory stack structure of FIG. 3H. Each exemplary memory stack structure 55 includes a semiconductor channel 60 which may comprise layers (601, 602) and a memory film 50. The memory film 50 may comprise a tunneling dielectric layer 506 laterally surrounding the semiconductor channel 60 and a vertical stack of charge storage regions laterally surrounding the tunneling dielectric layer 506 (as embodied as a memory material layer 504) and an optional blocking dielectric (e.g., 501, 503). The first exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor material layer 10), and a memory opening extending through the stack (32, 42). The semiconductor device further comprises a first blocking dielectric layer 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 5A:
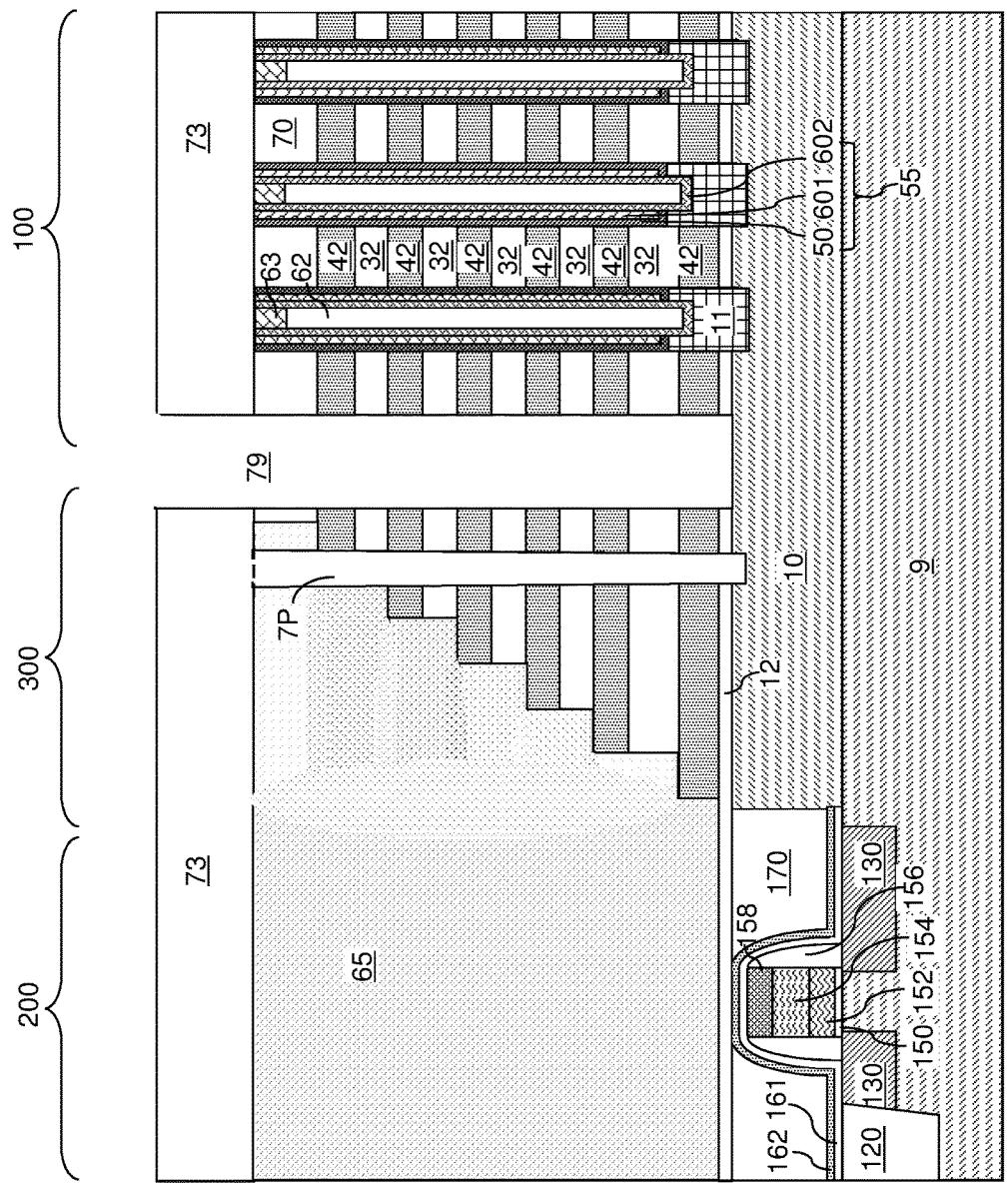
FIG. 5A is a vertical cross-sectional view of the first exemplary structure after formation of a backside trench according to the first embodiment of the present disclosure.
Figure 5B:
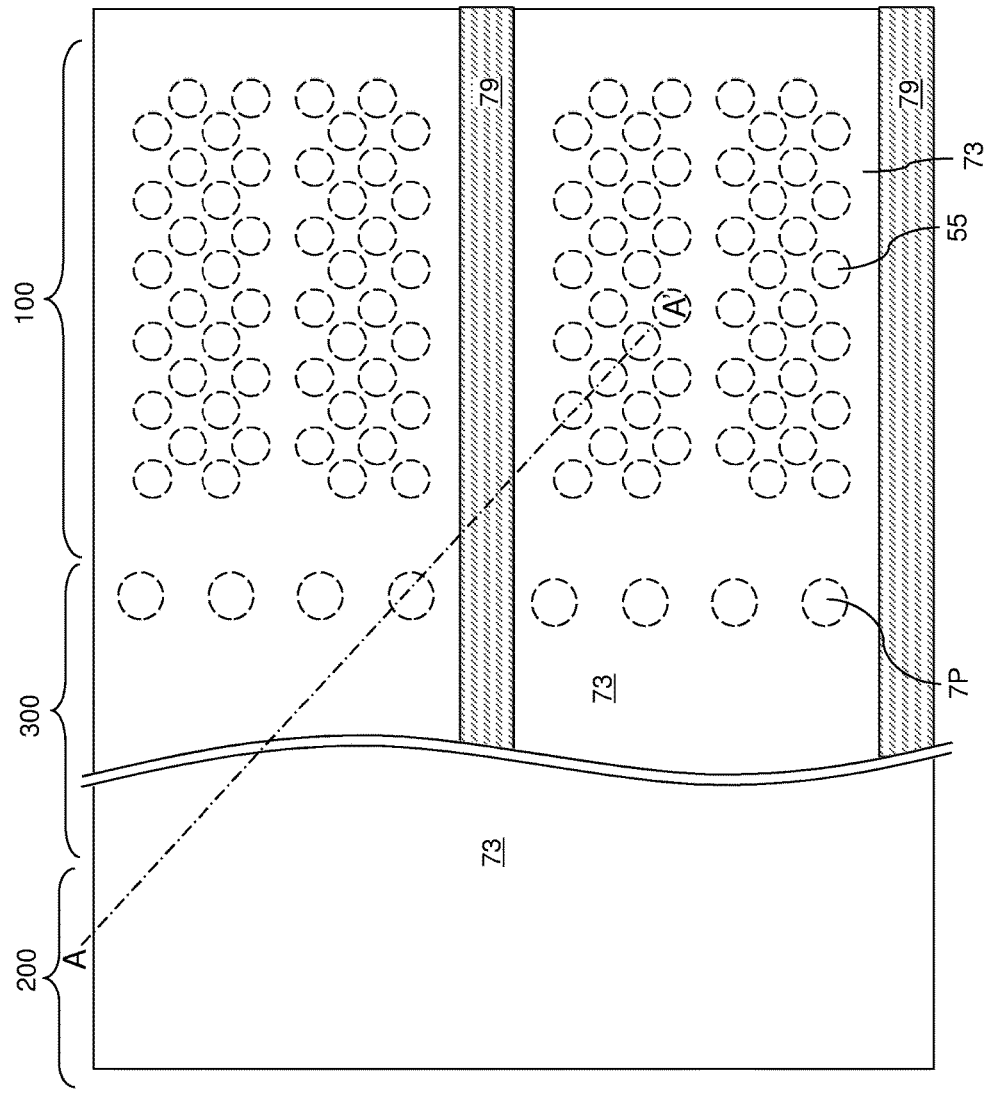
FIG. 5B is a partial see-through top-down view of the first exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the insulating cap layer 70 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the insulating cap layer 70 concurrently with deposition of the at least one dielectric support pillar 7P can be present over the insulating cap layer 70 as a contact level dielectric layer 73. Each of the at least one dielectric support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure.

The contact level dielectric layer 73 and the at least one dielectric support pillar 7P can be formed as a single continuous structure of integral construction, i.e., without any material interface therebetween. In another embodiment, the portion of the dielectric material that is deposited over the insulating cap layer 70 concurrently with deposition of the at least one dielectric support pillar 7P can be removed, for example, by chemical mechanical planarization or a recess etch. In this case, the contact level dielectric layer 73 is not present, and the top surface of the insulating cap layer 70 can be physically exposed.

A photoresist layer (not shown) can be applied over the alternating stack (32, 42), and is lithographically patterned to form at least one elongated opening in each area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

Figure 6:
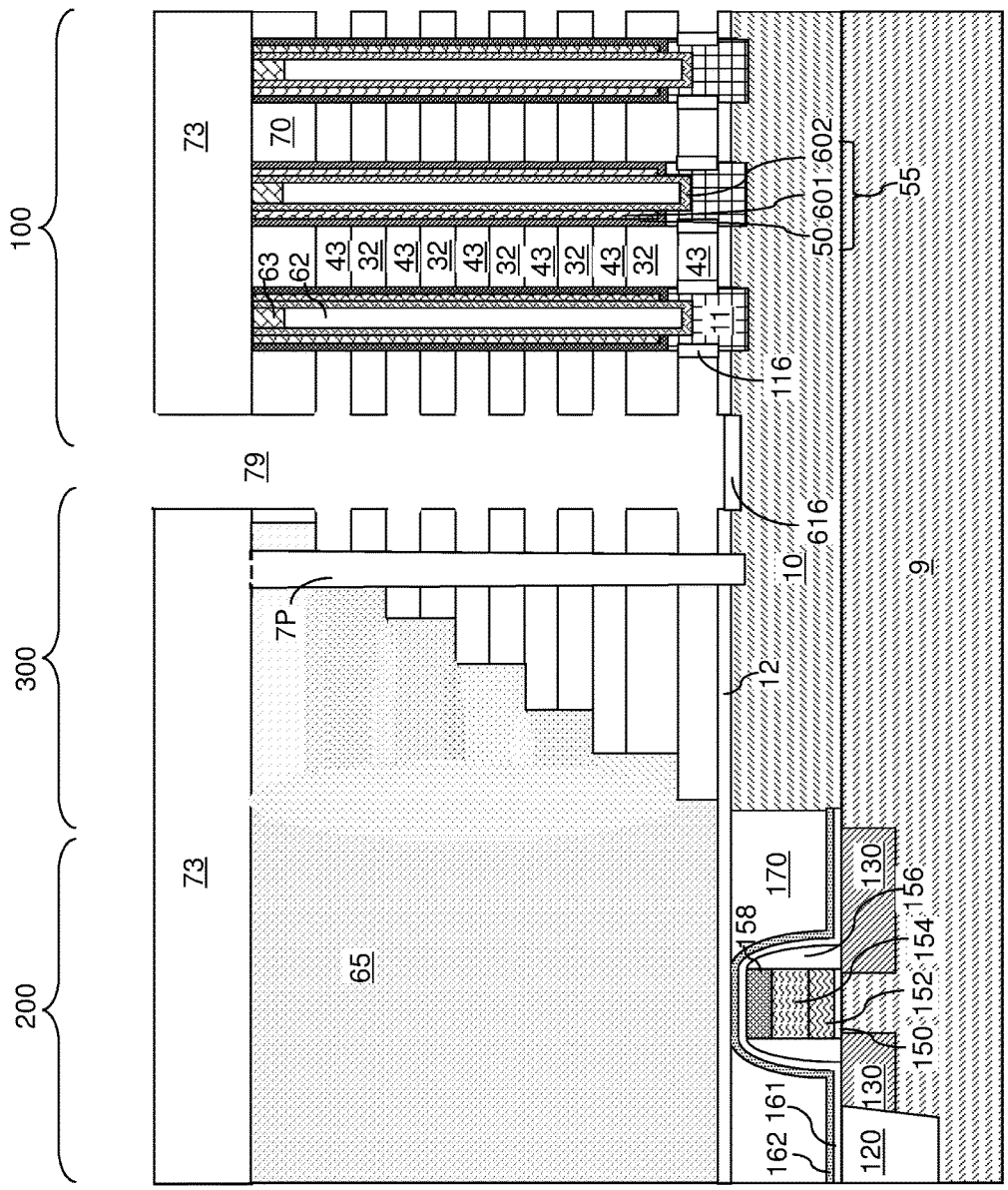
FIG. 6 is a vertical cross-sectional view of the first exemplary structure after formation of backside recesses according to the first embodiment of the present disclosure.

Referring to FIG. 6, an etchant that selectively etches the second material of the sacrificial material layers 42 with respect to the first material of the insulating layers 32 can be introduced into the at least one backside trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside trench 79 can be modified so that the bottommost surface of the at least one backside trench 79 is located within the gate dielectric layer 12, i.e., to avoid physical exposure of the top surface of the semiconductor material layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of the optional epitaxial channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert each physically exposed surface portion of the semiconductor material layer 10 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the semiconductor material layer and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the semiconductor material layer 10.

Figure 7:
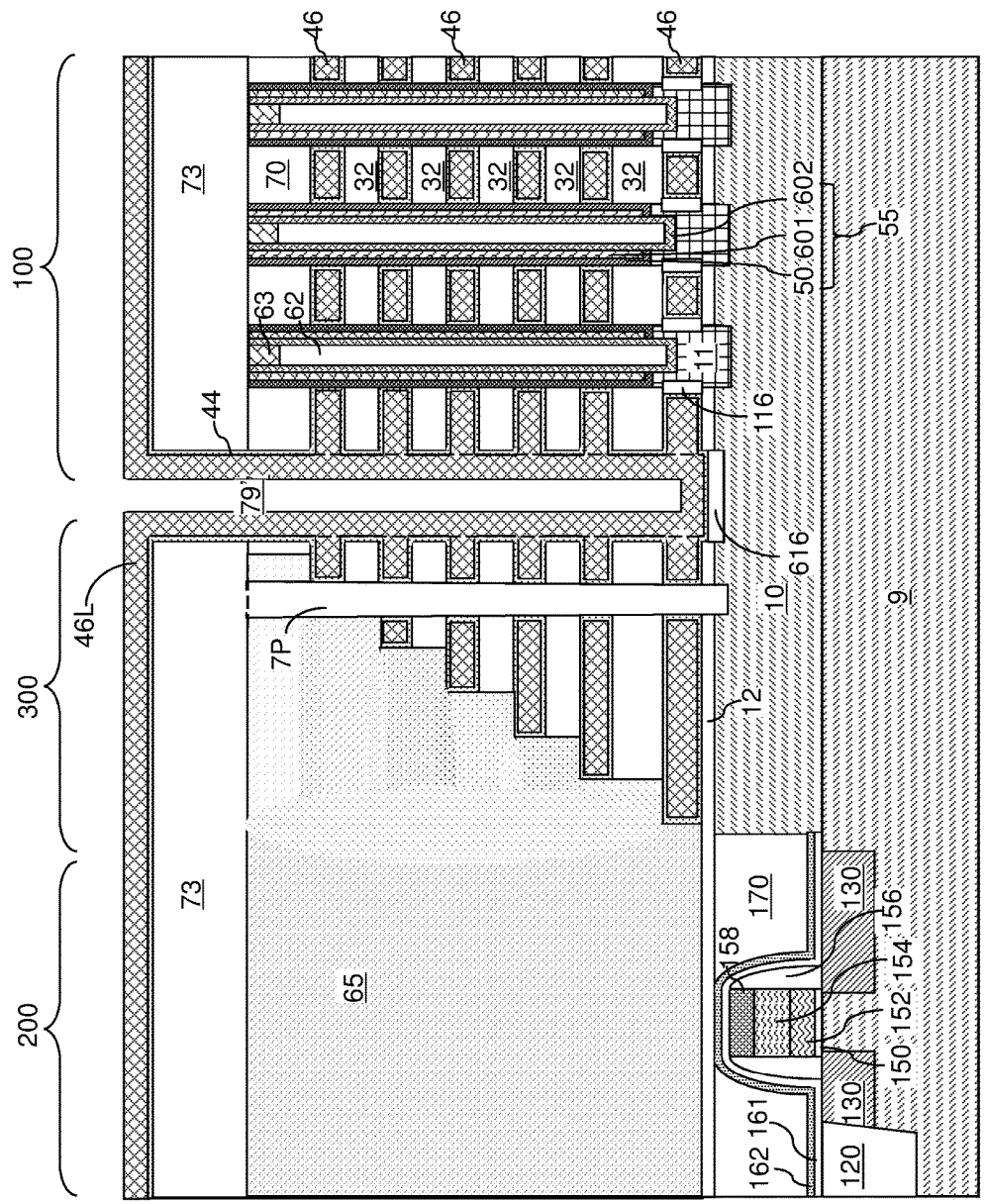
FIG. 7 is a vertical cross-sectional view of the first exemplary structure after formation of electrically conductive layers according to the first embodiment of the present disclosure.

Referring to FIG. 7, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer (501, 503) is present within each memory opening, the backside blocking dielectric layer is optional. In case the blocking dielectric layer (501, 503) is omitted, the backside blocking dielectric layer is present.

The backside blocking dielectric layer 44 can be formed in the backside recesses 43 and on a sidewall of the backside contact trench 79. If the backside blocking dielectric layer 44 is formed, formation of the dielectric spacers 116 and the sacrificial dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the at least one backside via trench 79, horizontal surfaces and sidewalls of the insulating layers 32, the portions of the sidewall surfaces of the memory stack structures 55 that are physically exposed to the backside recesses 43, and a top surface of the sacrificial dielectric portion 616. A backside cavity 79' is present within the portion of each backside via trench 79 that is not filled with the backside blocking dielectric layer.

At least one metallic material can be deposited in the plurality of backside recesses 43, on the sidewalls of the at least one the backside contact trench 79, and over the top surface of the contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a continuous metallic material layer 46L can be formed on the sidewalls of each backside contact trench 79 and over the contact level dielectric layer 73. Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A dielectric spacer 116 laterally surrounds a semiconductor portion that underlies the lower doped semiconductor portion (e.g., portion 11), wherein one of the electrically conductive layers laterally surrounds the dielectric spacer upon formation of the electrically conductive layers.

Figure 8:
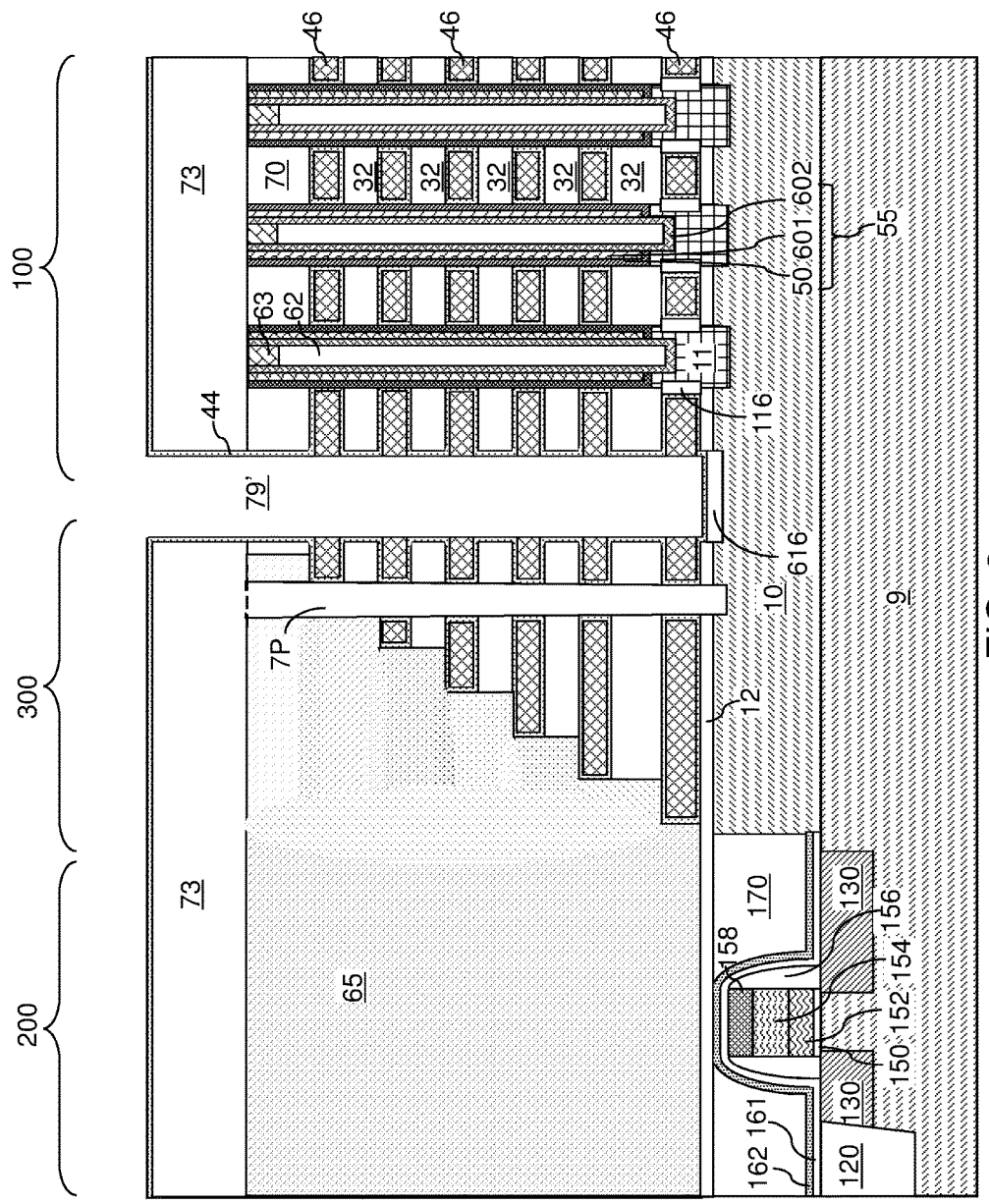
FIG. 8 is a vertical cross-sectional view of the first exemplary structure after removal of a deposited conductive material from within the backside trench according to the first embodiment of the present disclosure.

Referring to FIG. 8, the deposited metallic material of the continuous electrically conductive material layer 46L is etched back from the sidewalls of each backside contact trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

Figure 9:
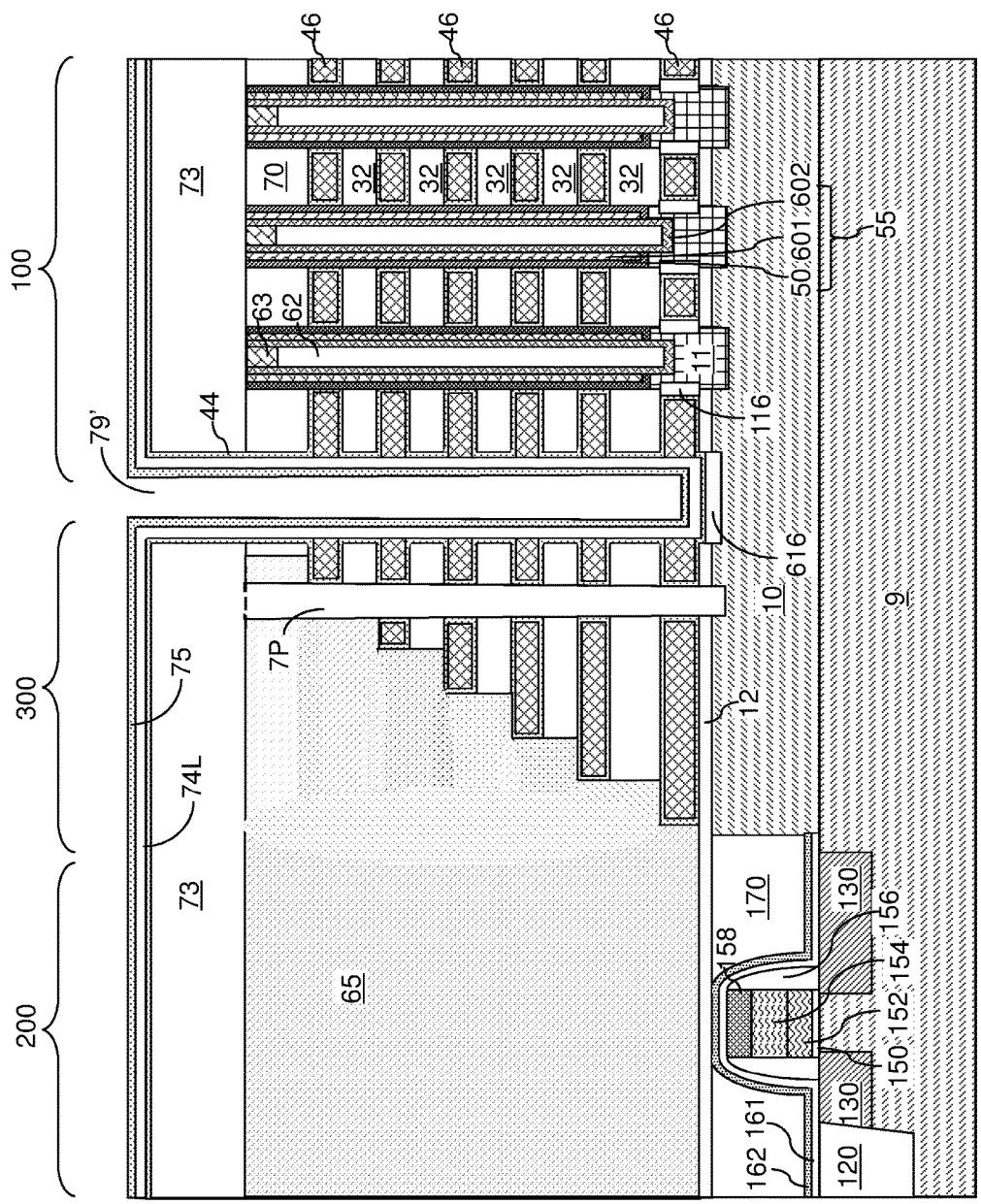
FIG. 9 is a vertical cross-sectional view of the first exemplary structure after deposition of an insulating material layer and an aluminum oxide liner according to the first embodiment of the present disclosure.

Referring to FIG. 9, an insulating material layer 74L can be formed in the at least one backside contact trench 79 and over the contact level dielectric layer 73 by a conformal deposition process. Exemplary conformal deposition processes include, but are not limited to, chemical vapor deposition and atomic layer deposition. The insulating material layer 74L includes an insulating material such as silicon oxide, silicon nitride, a dielectric metal oxide, an organosilicate glass, or a combination thereof. In one embodiment, the insulating material layer 74L can include silicon oxide. The insulating material layer 74L can be formed, for example, by low pressure chemical vapor deposition (LPCVD) or atomic layer deposition (ALD). The thickness of the insulating material layer 74L can be in a range from 1.5 nm to 60 nm, although lesser and greater thicknesses can also be employed.

An aluminum oxide liner layer 75L can be deposited over the sidewalls of the backside contact trench 79. A vertical portion of the aluminum oxide liner layer 75L can be deposited directly on the sidewalls of the insulating material layer 74L. A horizontal bottom portion of the aluminum oxide liner layer 75L can be formed directly on a horizontal bottom portion of the insulating material layer 74L at the bottom of the backside contact trench 79. Another horizontal portion of the aluminum oxide liner layer 75L can be deposited directly on a top surface of another horizontal portion of the insulating material layer 74L that overlies the contact level dielectric layer 73. The aluminum oxide liner layer 75L can be deposited employing a conformal deposition process such as atomic layer deposition. In one embodiment, the aluminum oxide liner layer 75L can include stoichiometric aluminum oxide ($Al_2O_3$) or non-stoichiometric aluminum oxide ($Al_2O_{3+\delta}$, $\delta>0$ or $\delta<0$). The thickness of the aluminum oxide liner layer 75L can be uniform throughout the entirety thereof, and can be in a range from 1 nm to 20 nm, although lesser and greater thicknesses can also be employed. A backside cavity 79' is present within the backside contact trench 79.

Figure 10:
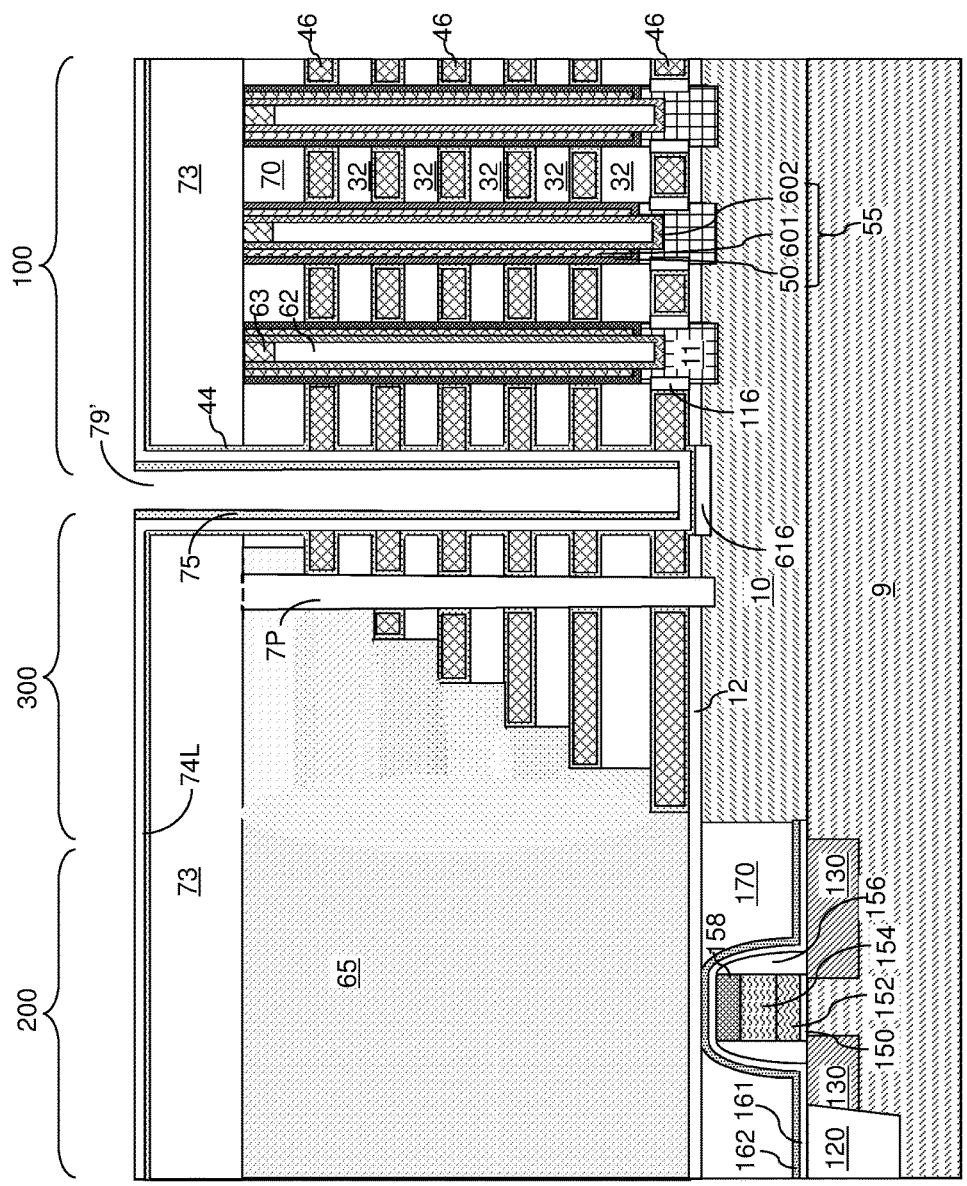
FIG. 10 is a vertical cross-sectional view of the first exemplary structure after anisotropically etching horizontal portions of the aluminum oxide liner according to the first embodiment of the present disclosure.

Referring to FIG. 10, the aluminum oxide liner layer 75L is anisotropically etched, for example, employing a reactive ion etch, such as a sidewall spacer etch. In one embodiment, the aluminum oxide liner layer 75L can be etched selective to the insulating material layer 74L. The remaining portion of the aluminum oxide liner layer 75L can be a substantially vertical aluminum oxide liner 75, and can cover the entire inner sidewall of a vertical portion of the insulating material layer 74L in the backside contact trench 79. A top surface of a horizontal portion of the insulating material layer 74L can be physically exposed underneath and opening in the aluminum oxide liner 75. A backside cavity 79' is present inside the aluminum oxide liner 75.

Figure 11:
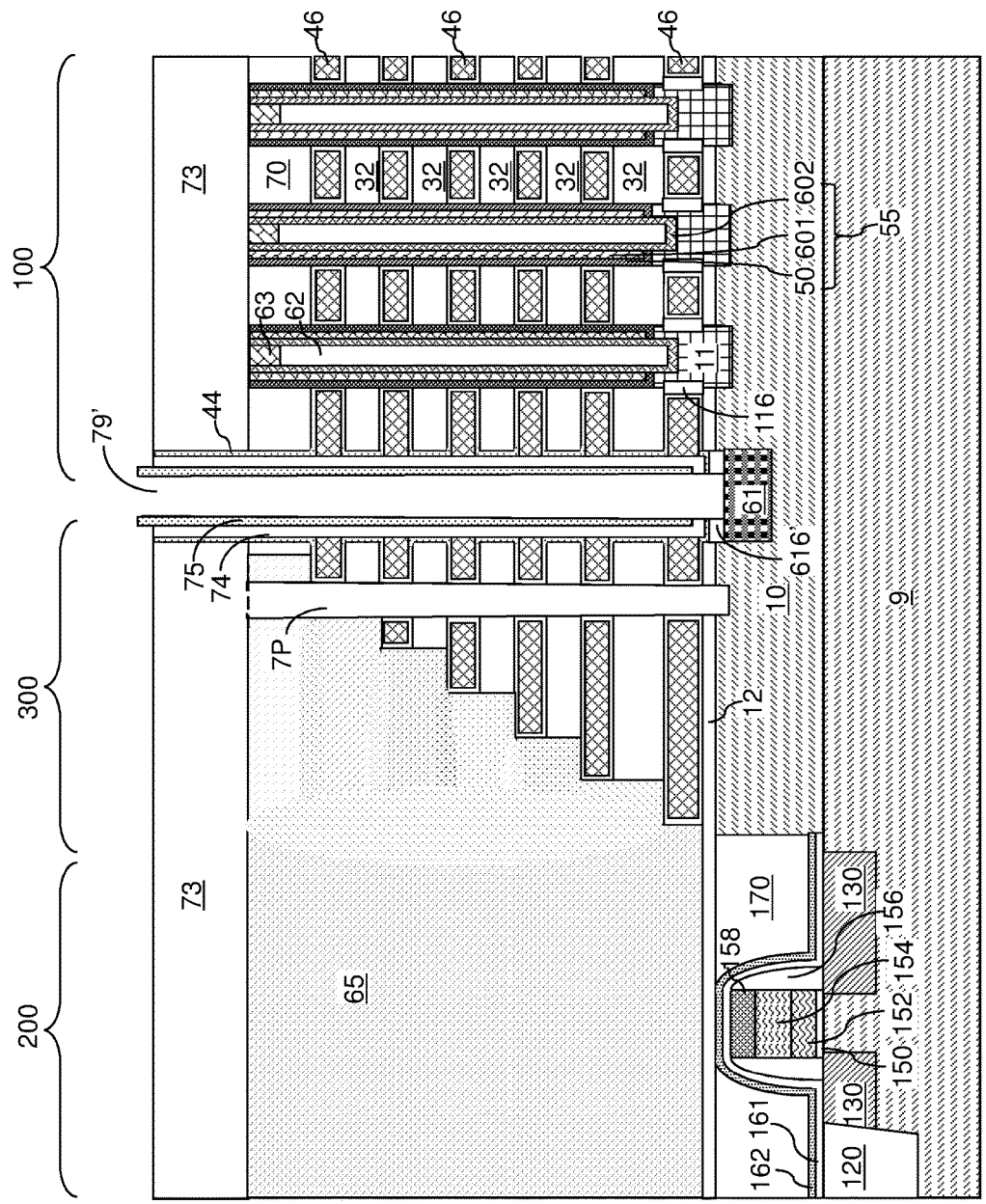
FIG. 11 is a vertical cross-sectional view of the first exemplary structure after anisotropically etching horizontal portions of the insulating material layer according to the first embodiment of the present disclosure.

Referring to FIG. 11, an etch process can be performed to remove horizontal portions of the insulating material layer 74L. The etch process can be an anisotropic etch process or an isotropic etch process. A remaining portion of the insulating material layer 74L in the backside contact trench 79 constitutes an insulating spacer 74. The insulating spacer 74 laterally surrounds the aluminum oxide liner 75. In one embodiment, the etch process can be an anisotropic etch process, and an inner sidewall of a horizontal portion of the insulating spacer 74 underlying the aluminum oxide layer can be vertically coincident with an inner sidewall of the aluminum oxide liner 75 which protects the insulating spacer 74 from being over etched. In other words, the aluminum oxide liner 75 reduces or prevents the widening of the top of the trench 79 during the etching of layer 74L, and thus prevents or reduces a short circuit between the drain contact via structure 88 to be subsequently formed (i.e., drain electrode or local interconnect shown in FIG. 13) and the contact via structure 76 to be subsequently formed (i.e., source electrode or local interconnect shown in FIG. 13). In one embodiment, the anisotropic etch can be selective to aluminum oxide, and the aluminum oxide liner 75 can extend above the topmost surface of the insulating spacer 74 after formation of the insulating spacer 74. Subsequently, horizontal portions of the backside blocking dielectric layer 44 are etched. If a sacrificial dielectric portion 616 is provided, the anisotropic etch can be continued to etch through a center portion of the sacrificial dielectric portion 616 to physically expose a top surface of the substrate (9, 10) at the bottom of the backside contact trench 79. The remaining portion of the sacrificial dielectric portion 616 constitutes an annular semiconductor oxide spacer 616', which can be an oxide of the semiconductor material of the semiconductor material layer 10.

A source region 61 can be formed at the bottom of each cavity 79' by implantation of electrical dopants into surface portions of the semiconductor material layer 10 that underlie an opening through the stack of the aluminum oxide liner 75 and the insulating spacer 74. Each source region 61 is formed in a surface portion of the substrate (9, 10) that underlies a respective opening through the aluminum oxide liner 75 and the insulating spacer 74. Due to the straggle of the implanted dopant atoms during the implantation process and lateral diffusion of the implanted dopant atoms during a subsequent activation anneal process, each source region 61 can contact a bottom surface of the insulating spacer 74. The bottommost surface of an overlying portion of the aluminum oxide liner 75 can be vertically spaced from the underlying source region 61 by an annular portion of the insulating spacer 74. The vertical separation distance between the bottommost surface of the overlying portion of the aluminum oxide liner 75 and the underlying source region 61 can be the same as the thickness of the annular horizontal portion of the insulating spacer 74. As used herein, an "annular" portion refers to any portion having a single opening therethrough.

Figure 12:
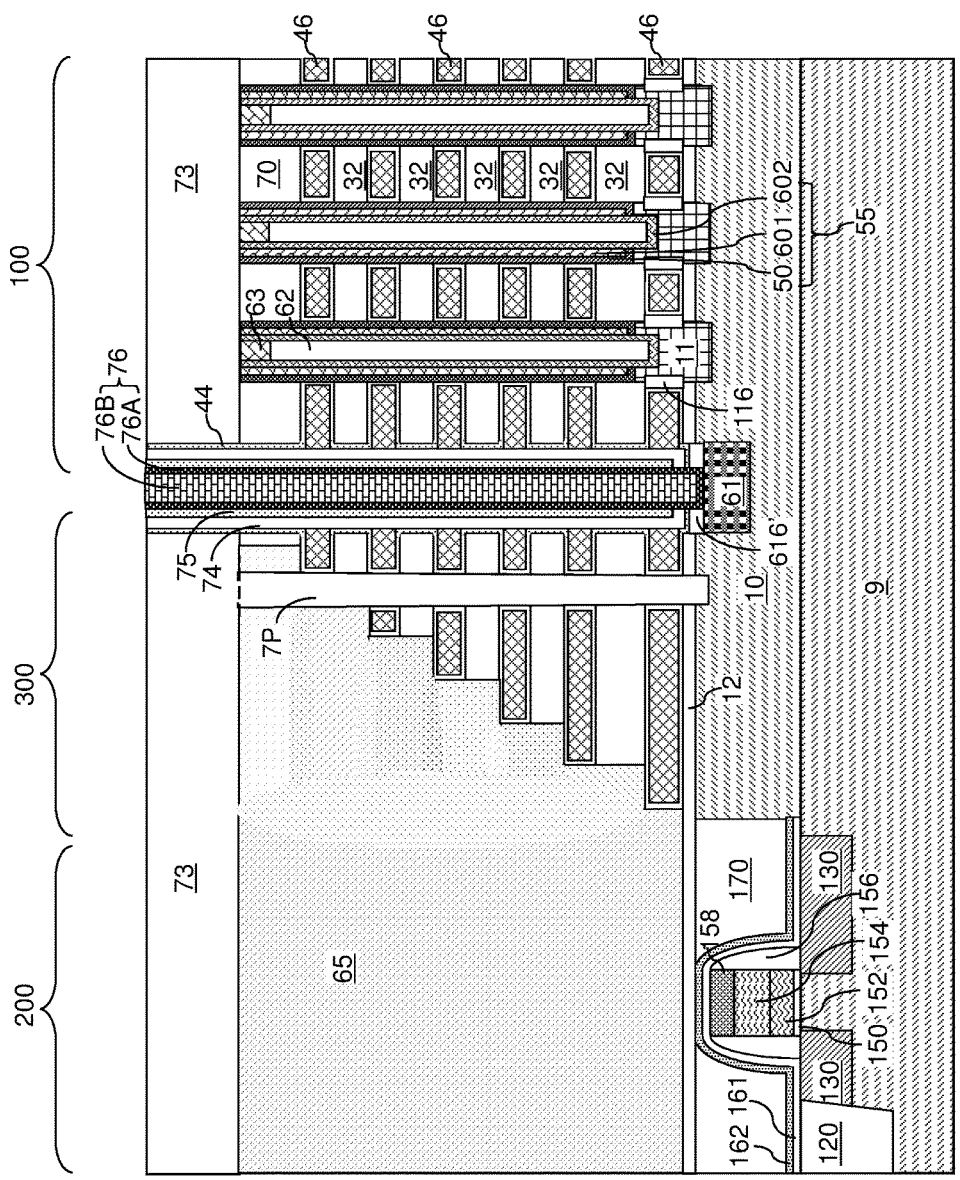
FIG. 12 is a vertical cross-sectional view of the first exemplary structure after formation of a backside contact via structure according to the first embodiment of the present disclosure.

Referring to FIG. 12, a contact via structure 76 can be formed within each cavity 79'. Each contact via structure 76 can fill a respective cavity 79'. Each contact via structure 76 can be formed inside a vertical portion of the aluminum oxide liner 75 located within a respective backside contact trench 79. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76. Each contact via structure 76 can be formed directly on a top surface of a source region 61. Each contact via structure 76 can be formed directly on an inner sidewall of a vertical portion of the aluminum oxide liner 75 within the respective backside contact trench 79. The contact via structure 76 is formed inside the aluminum oxide liner 75 and on a physically exposed surface of the substrate (9, 10) underneath the trench 79.

Figure 13:
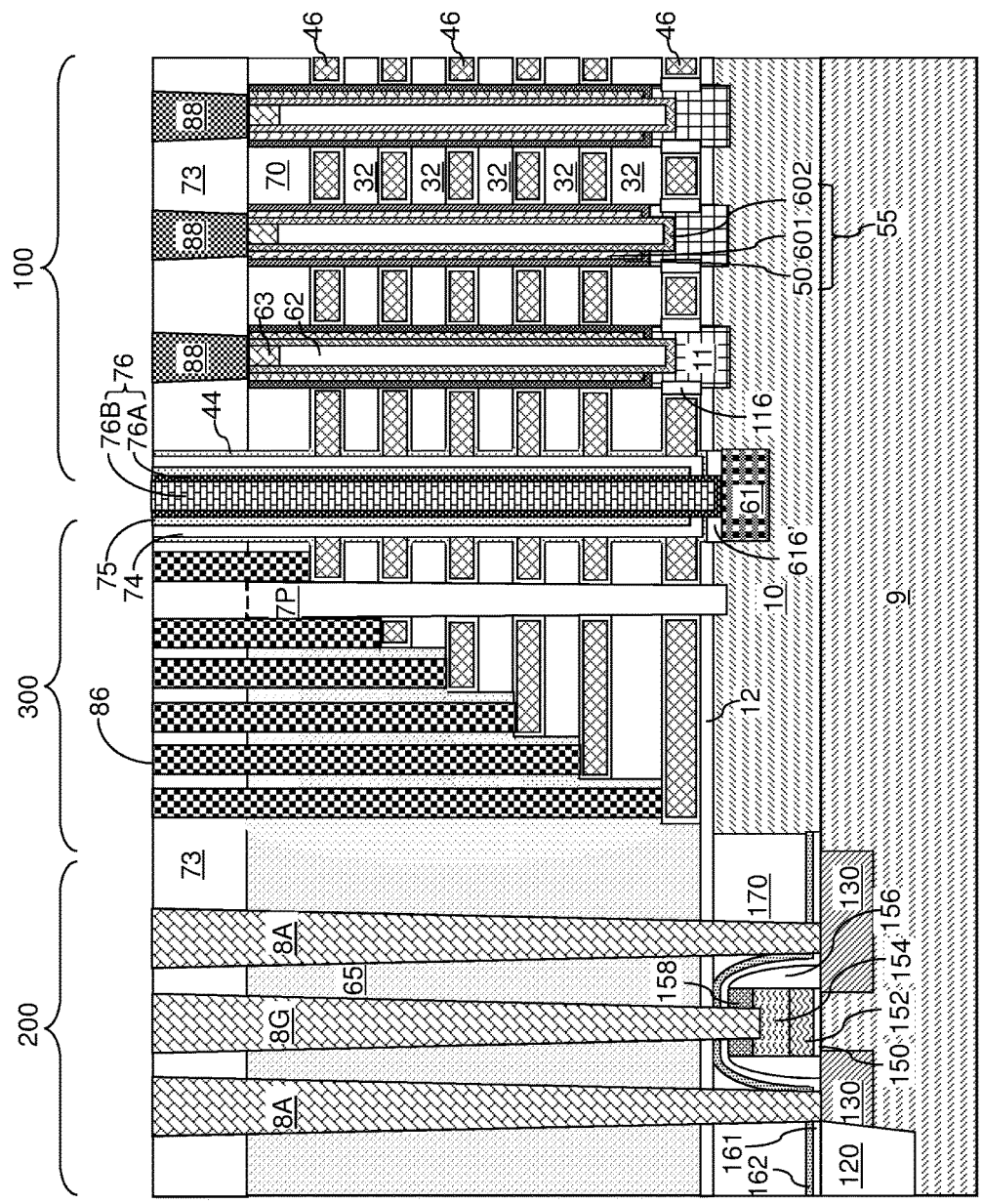
FIG. 13 is a vertical cross-sectional view of the first exemplary structure after formation of additional contact via structures according to the first embodiment of the present disclosure.

Referring to FIG. 13, additional contact via structures (88, 86, 8A, 8G) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral gate contact via structures 8G and peripheral active region contact via structures 8A can be formed through the retro-stepped dielectric material portion 65 directly on respective nodes of the peripheral devices.

The first exemplary structures of the present disclosure can include a three-dimensional memory device that comprises: an alternating stack of insulating layers 32 and electrically conductive layers 46 located over a substrate (9, 10); a trench 79 extending through the stack of alternating layers (32, 46); an aluminum oxide liner 75 extending through each level of the insulating layers 32 within the alternating stack (32, 46) and including an opening at its bottom part; and a contact via structure 76 located inside the aluminum oxide liner 75 and contacting a portion of the substrate (9, 10), such as a source region 61.

The first exemplary structure includes a three-dimensional memory device, which includes an alternating stack of insulating layers 32 and electrically conductive layers 46 located over a substrate (9, 10); a plurality of memory stack structures 55 extending through the alternating stack (32, 46), wherein each of the plurality of memory stack structures 55 comprises a memory film 50 and a semiconductor channel 60 (e.g., 601, 602) that is laterally surrounded by the memory film 50; a trench 79 extending through the stack of alternating layers; an insulating spacer 74 comprising a dielectric material and located at a periphery of the trench 79; an aluminum oxide liner 75 located inside the insulating spacer 74; and a contact via structure 76 located inside the aluminum oxide liner 75 and contacting a portion of the substrate (9, 10).

In one embodiment, a bottom surface of the aluminum oxide liner 75 is vertically spaced from the substrate (9, 10) by a horizontal portion of the insulating spacer 74. In one embodiment, a top surface of the insulating spacer 74, a top surface of the aluminum oxide liner 75, and a top surface of the contact via structure 76 can be within the same horizontal plane.

Figure 14:
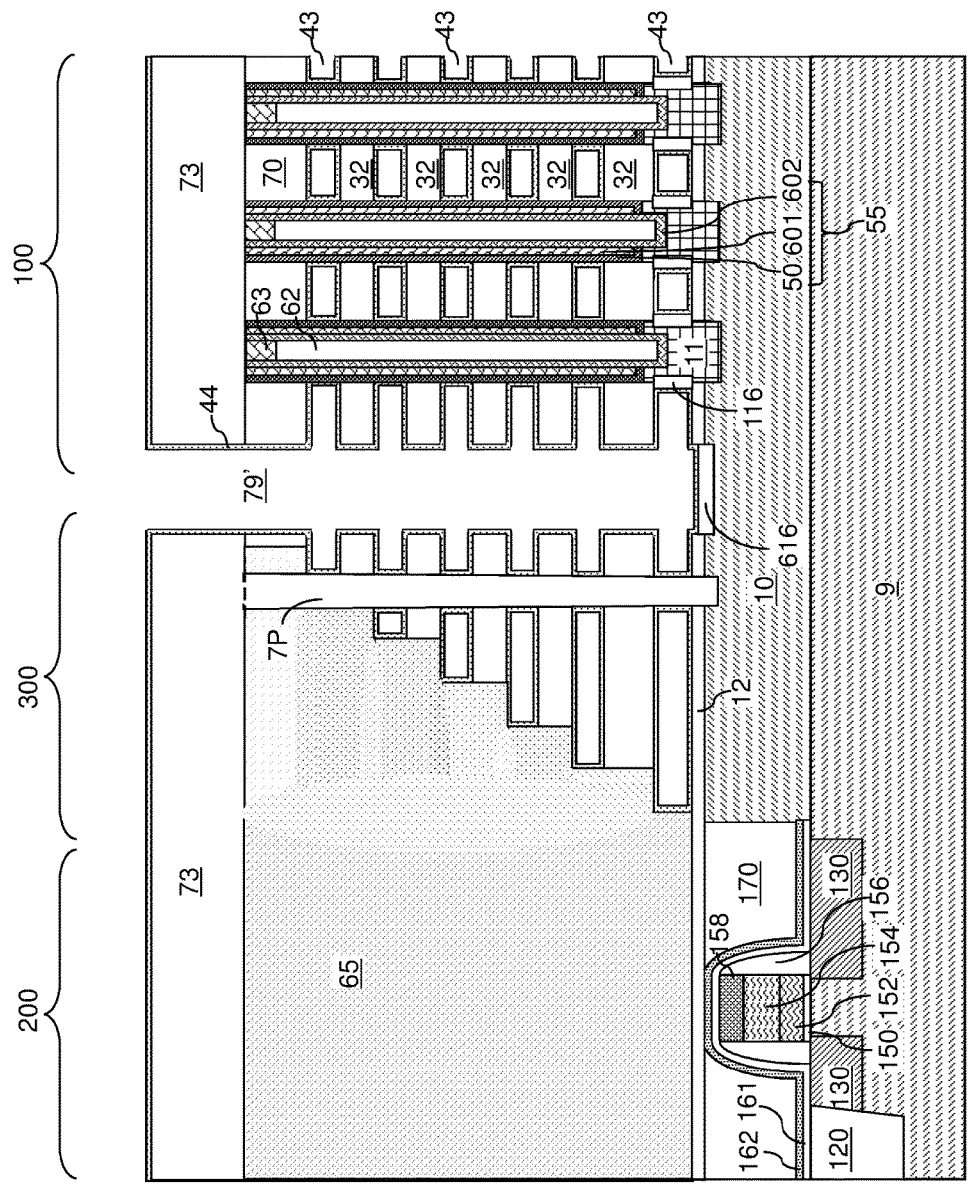
FIG. 14 is a vertical cross-sectional view of a second exemplary structure after formation of an aluminum oxide backside blocking dielectric layer according to a second embodiment of the present disclosure.

Referring to FIG. 14, a second exemplary structure according to a second embodiment of the present disclosure can be derived from the first exemplary structure of FIG. 6 by forming an aluminum oxide backside blocking dielectric layer 144 in the backside recesses 43 and on a sidewall of the backside contact trench 79 as the backside blocking dielectric layer 144. In other words, an aluminum oxide layer employed as the backside blocking dielectric layer 144 is present rather than being optional as in the first embodiment. In this case, formation of the dielectric spacers 116 and the sacrificial dielectric portion 616 prior to formation of the aluminum oxide backside blocking dielectric layer 144 is optional. In one embodiment, the aluminum oxide backside blocking dielectric layer 144 can be formed by a conformal deposition process such as atomic layer deposition (ALD). The aluminum oxide backside blocking dielectric layer 144 can consist essentially of aluminum oxide. The thickness of the aluminum oxide backside blocking dielectric layer 144 can be in a range from 1 nm to 15 nm, such as 2 to 6 nm, although lesser and greater thicknesses can also be employed.

Figure 15:
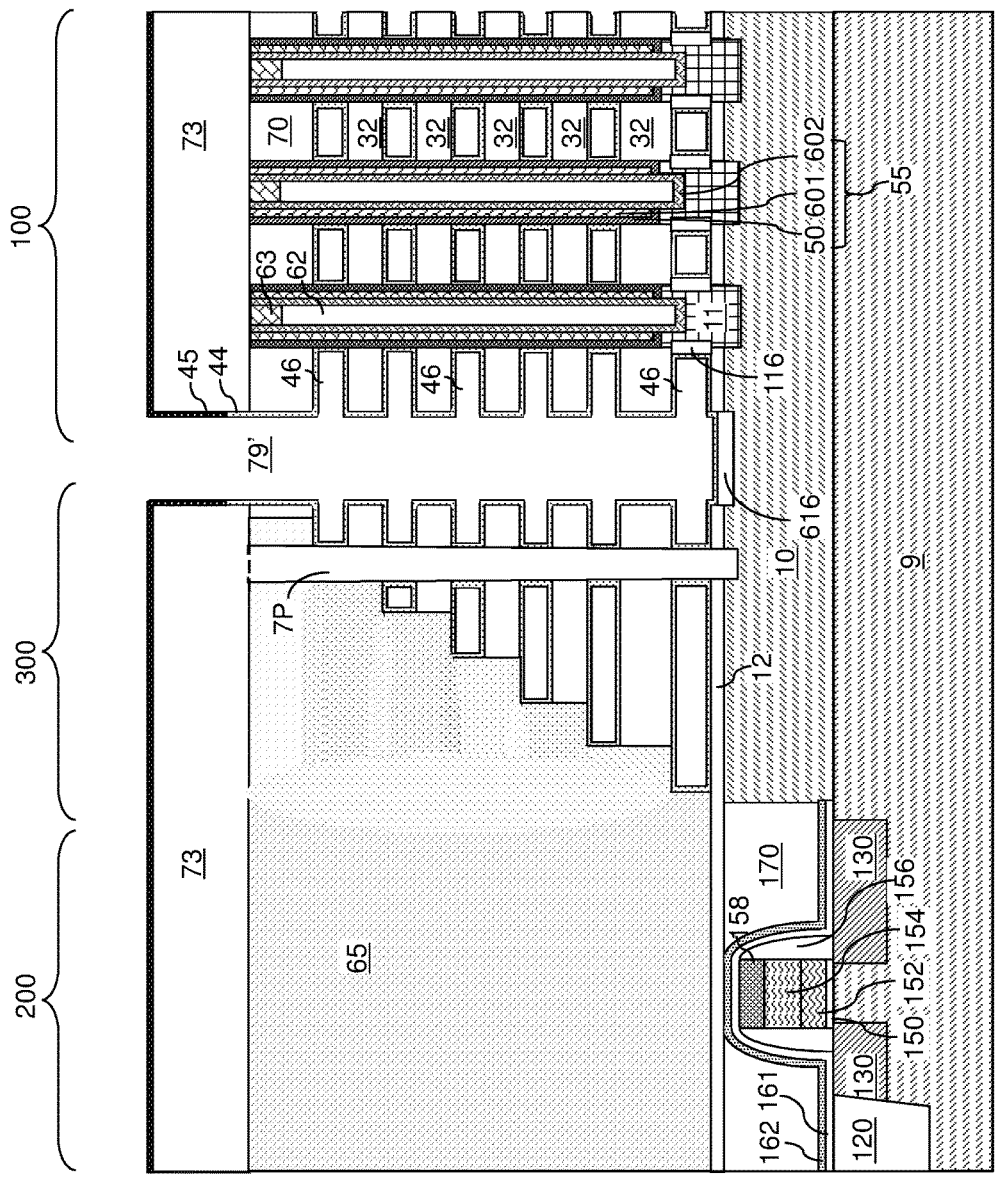
FIG. 15 is a vertical cross-sectional view of the second exemplary structure after conversion of an upper portion of the aluminum oxide backside blocking dielectric layer into an aluminum compound layer according to the second embodiment of the present disclosure.

Referring to FIG. 15, an upper portion of the aluminum oxide backside blocking dielectric layer 144 can be converted into an aluminum compound layer 45. Specifically, a non-metallic element other than oxygen can be implanted into the upper portion of the aluminum oxide backside blocking dielectric layer 144 to convert the implanted portion of the aluminum oxide backside blocking dielectric layer 144 into the aluminum compound layer 45.

Ion implantation can be employed to implant the non-metallic element only into the upper portion of the aluminum oxide backside blocking dielectric layer 144, while preventing implantation of the non-metallic element into a lower portion of the aluminum oxide backside blocking dielectric layer 144. In one embodiment, the non-metallic element other than oxygen can be implanted employing angled ion implantation at a non-zero angle with respect to the vertical direction. In one embodiment, the non-zero angle can be selected to avoid implantation of the non-metallic element into a lower portion of the aluminum oxide backside blocking dielectric layer 144 in the trench 79. The angle of ion implantation, as measured from the vertical direction that is perpendicular to the top surface 7 of the substrate (9, 10) can be in a range from 5 degrees to 60 degrees, although lesser and greater angles can also be employed. The boundary between the implanted portion and non-implanted portion of the aluminum oxide backside blocking dielectric layer 144 may be within the level of the contact level dielectric layer 73 or within the level of the insulating cap layer 70. The angled ion implantation can limit the vertical extent of the aluminum compound layer 45 above the levels of electrically conductive layers to be subsequently formed. Thus, electrical characteristics of the electrically conductive layers are not affected by formation of the aluminum compound layer 45.

In one embodiment, the non-metallic element other than oxygen can be selected from silicon, nitrogen, and fluorine. In this case, the aluminum compound layer 45 can comprise a material selected from aluminum silicon oxide (e.g., aluminum silicate), aluminum oxynitride, aluminum nitride, aluminum oxyfluoride and aluminum fluoride.

Figure 16:
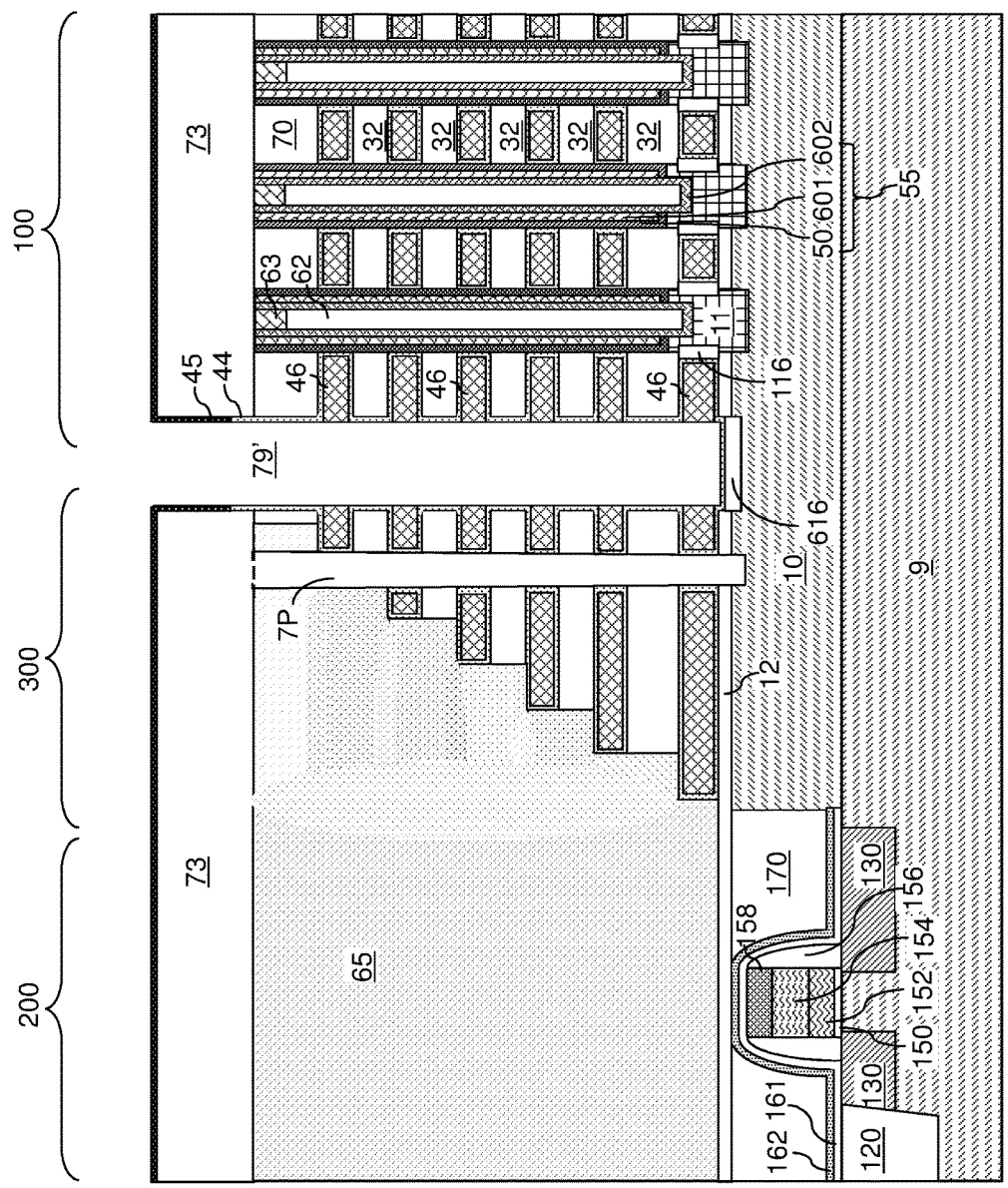
FIG. 16 is a vertical cross-sectional view of the second exemplary structure after formation of electrically conductive layers according to the second embodiment of the present disclosure.

Referring to FIG. 16, the processing steps of FIGS. 7 and 8 can be performed to form electrically conductive layers 46, which fill the remaining volumes of the backside recesses 43. The aluminum compound layer 45 can provide enhanced protection to the contact level dielectric layer 73 during removal of the continuous metallic material layer 46L from inside the backside contact trench 79 and from above the contact level dielectric layer 43 because of the composition of the aluminum compound layer 45, i.e., due to the presence of the addition non-metallic element other than oxygen that is selected from silicon, nitrogen, and fluorine, which makes the material of layer 45 more etch resistant than the aluminum oxide material of layer 44.

Figure 17:
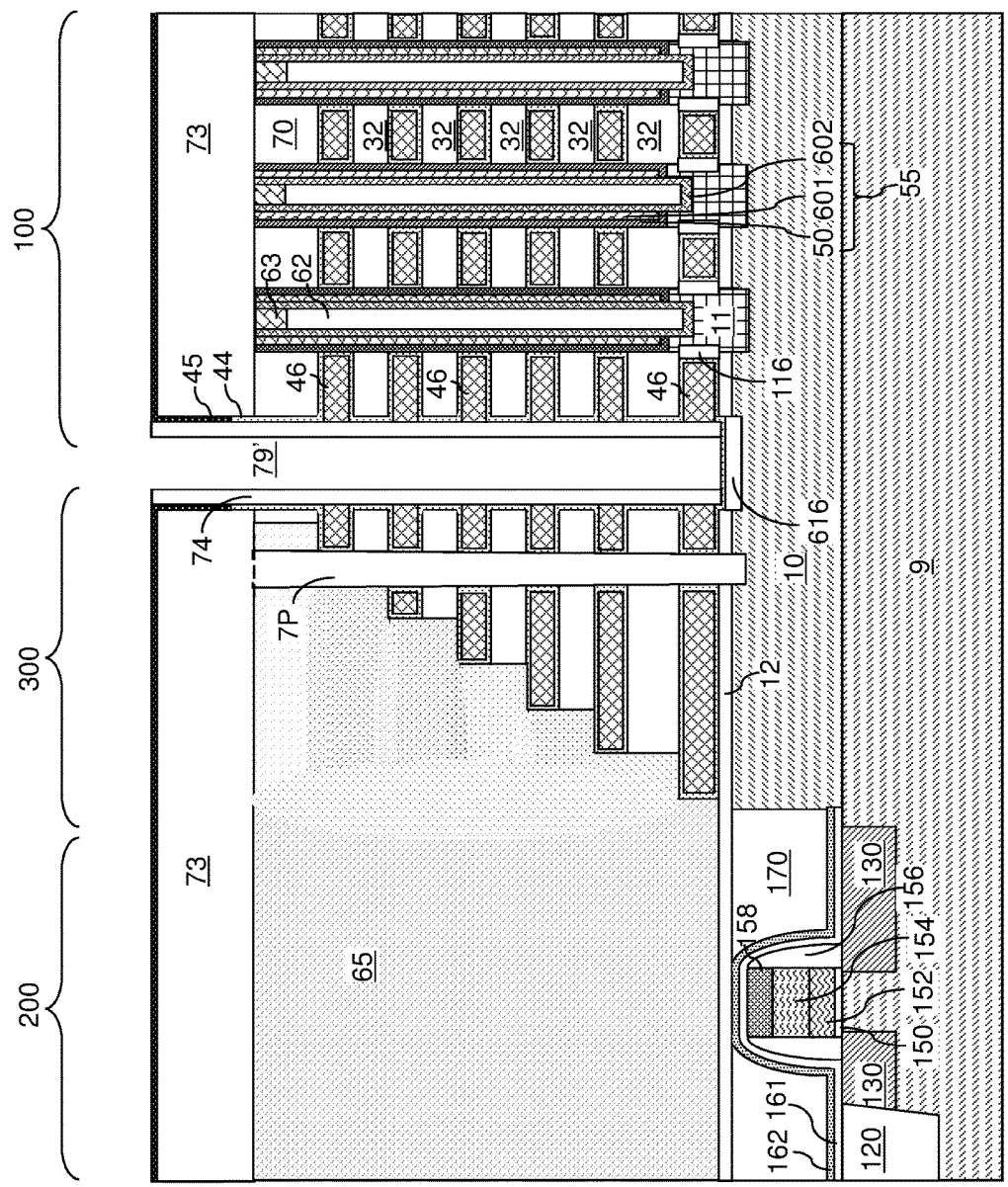
FIG. 17 is a vertical cross-sectional view of the second exemplary structure after formation of an insulating spacer according to the second embodiment of the present disclosure.

Referring to FIG. 17, an insulating spacer 74 can be formed by deposition of an insulating material layer and anisotropic etch. The insulating spacer 74 includes a dielectric material such as silicon oxide, silicon nitride, silicon oxynitride, or organosilicate glass. The insulating spacer 74 can be formed on the sidewalls of the electrically conductive layers 46 and on a vertical portion of the aluminum oxide backside blocking dielectric layer 144 and the aluminum compound layer 45. In an alternative embodiment, the aluminum oxide liner 75 of the first embodiment may be formed over the insulating spacer 74. In one optional embodiment, the top portion of the aluminum oxide liner 75 may also be implanted with at least one of silicon, nitrogen, and fluorine using an angled implant to form an aluminum compound layer (e.g., aluminum silicon oxide, aluminum nitride or oxynitride, or aluminum fluoride or oxyfluoride) at the top of the aluminum oxide liner 75. A single angled implant may be used to form an aluminum compound layer in both the blocking dielectric 44 and the aluminum oxide liner 75. Alternatively, separate implants may be used for the blocking dielectric 44 and the aluminum oxide liner 75.

Figure 18:
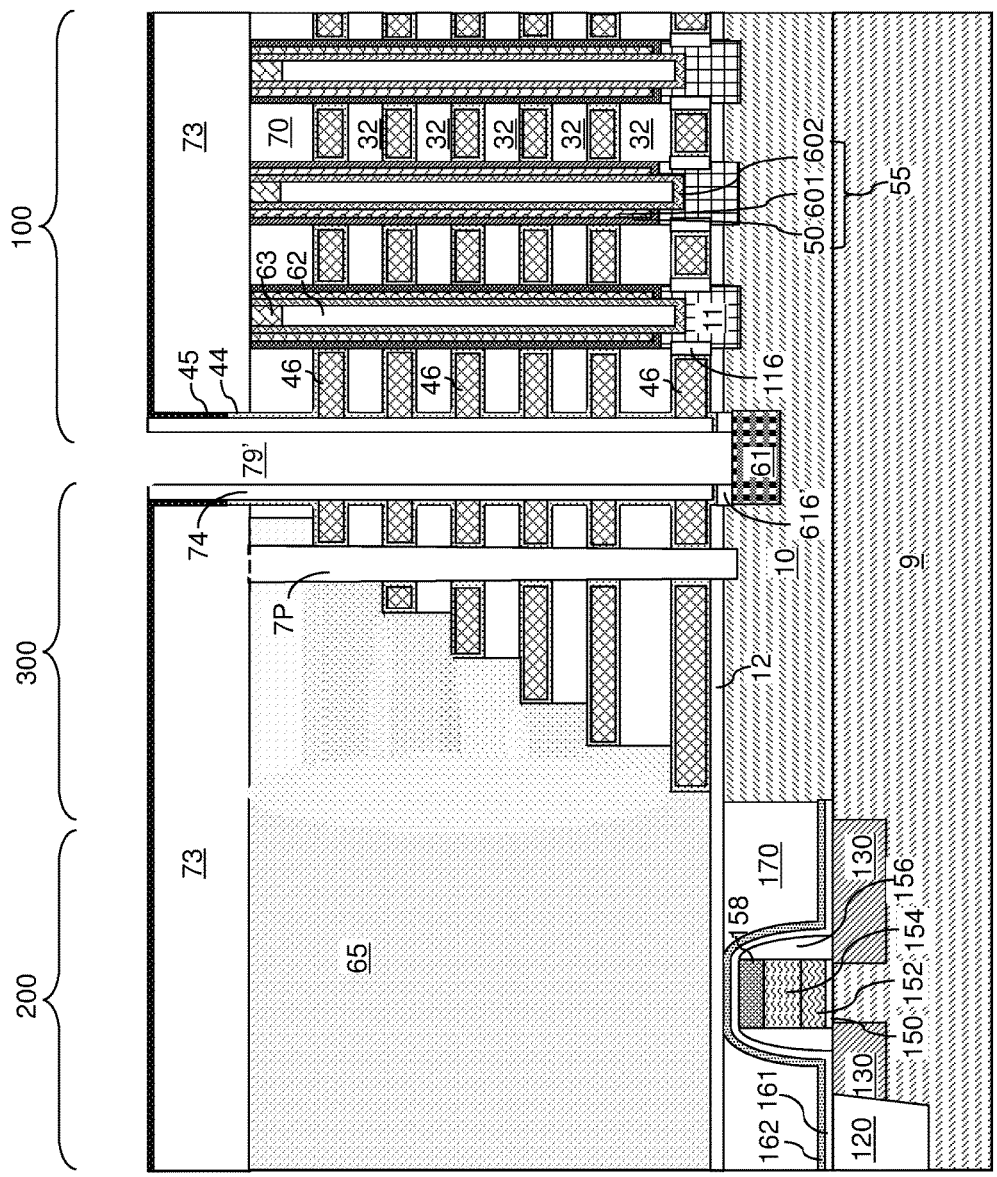
FIG. 18 is a vertical cross-sectional view of the second exemplary structure after physically exposing a top surface of the substrate at the bottom of the backside contact trench according to the second embodiment of the present disclosure.

Referring to FIG. 18, and anisotropic etch can be performed to etch a horizontal portion of the aluminum oxide backside blocking dielectric layer 144 at the bottom of the backside contact trench 79. If a sacrificial dielectric portion 616 is provided, the anisotropic etch can be continued to etch through a center portion of the sacrificial dielectric portion 616 to physically expose a top surface of the substrate (9, 10) at the bottom of the backside contact trench 79. The remaining portion of the sacrificial dielectric portion 616 constitutes an annular semiconductor oxide spacer 616', which can be an oxide of the semiconductor material of the semiconductor material layer 10. A source region 61 can be formed in the same manner as in the first embodiment. The horizontal portion of the aluminum compound layer 45 may remain substantially intact, may be partially etched, or may be completely etched depending on the etch chemistry employed to etch through the horizontal portion of the aluminum oxide backside blocking dielectric layer 144 and a center portion of the sacrificial dielectric portion 616. In one embodiment, the anisotropic etch may be selective to the material of the aluminum compound layer 45, and the aluminum compound layer 45 may remain substantially intact after the anisotropic etch to protect layer 73 and to avoid the short between elements 76 and 88, as described above.

Figure 19:
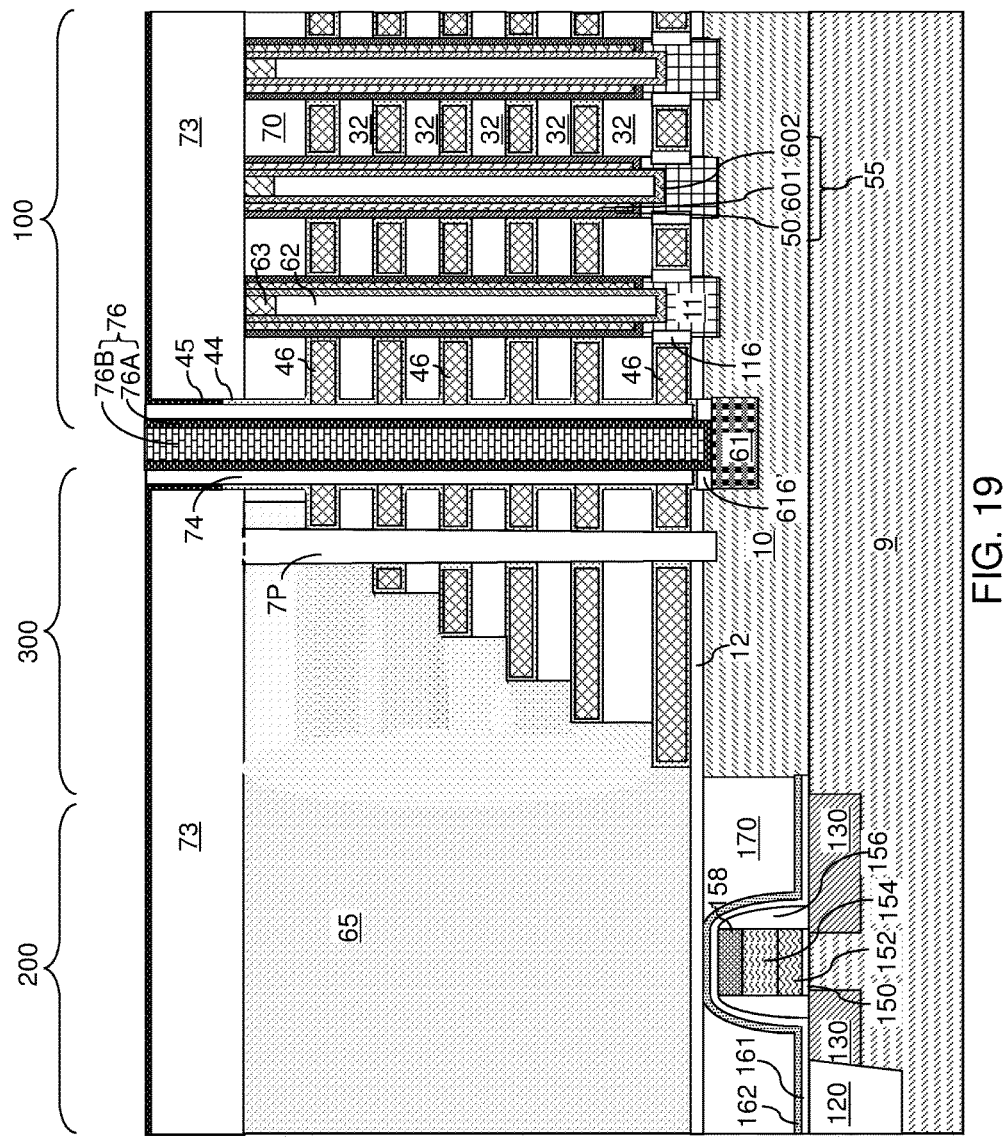
FIG. 19 is a vertical cross-sectional view of the second exemplary structure after formation of a backside contact structure according to the second embodiment of the present disclosure.

Referring to FIG. 19, the processing steps of FIG. 12 can be performed to form a backside contact structure 76. The contact via structure 76 can be formed inside a remaining volume of the backside contact trench 79. The contact via structure 76 can be laterally surrounded by remaining portion of the aluminum oxide backside blocking dielectric layer 144 and a vertical portion of the aluminum compound layer 45.

In one embodiment, the aluminum compound layer 45 can be employed as a planarization stopping layer during a planarization process that removes excess conductive materials from above the contact level dielectric layer 73. If a recess etch is employed during the planarization process, the aluminum compound layer 45 can be employed as an etch stop layer. If chemical mechanical planarization (CMP) is employed during the planarization process, the aluminum compound layer 45 can be employed as a planarization stopping layer.

Figure 20:
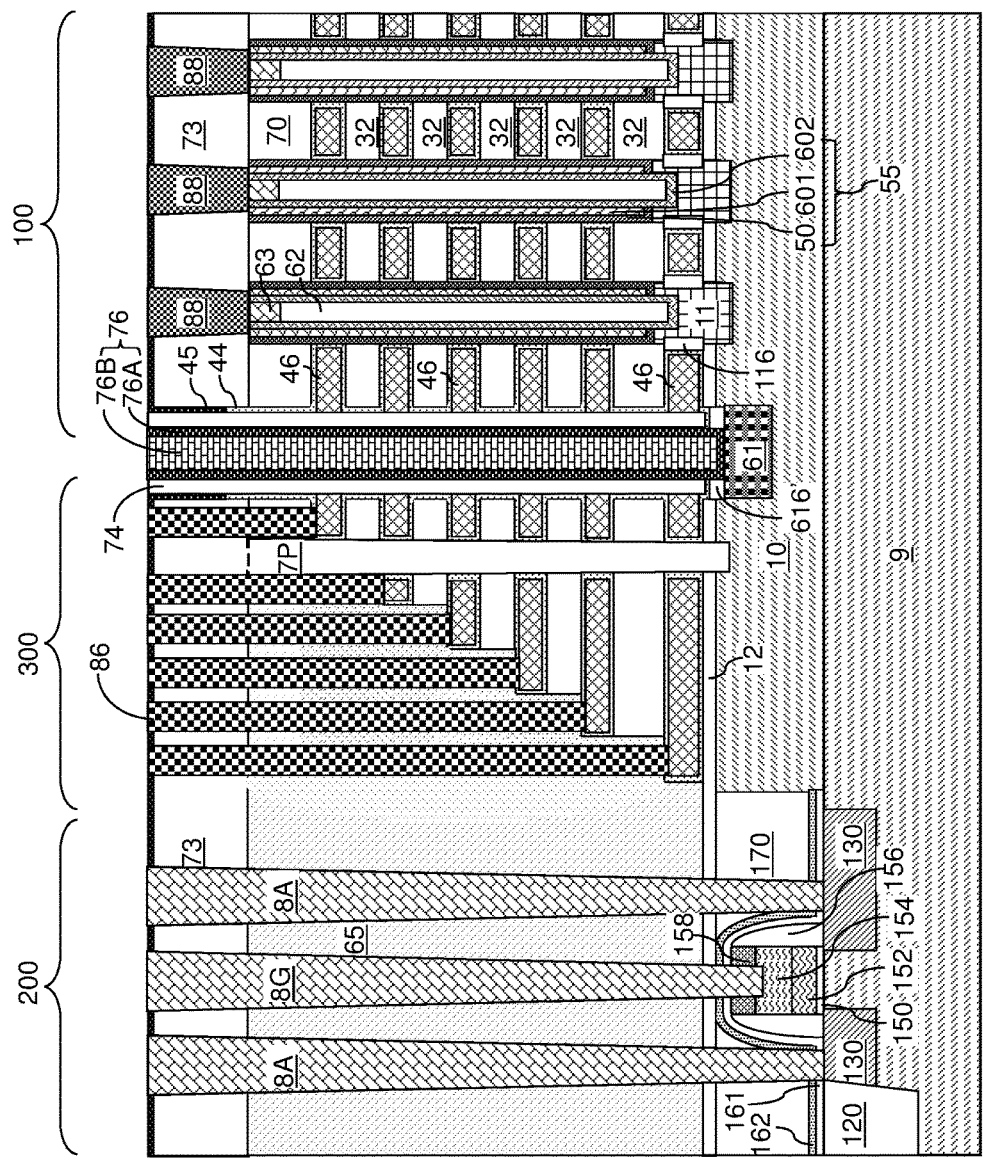
FIG. 20 is a vertical cross-sectional view of the second exemplary structure after formation of additional contact via structures according to the second embodiment of the present disclosure.
Figure 21:
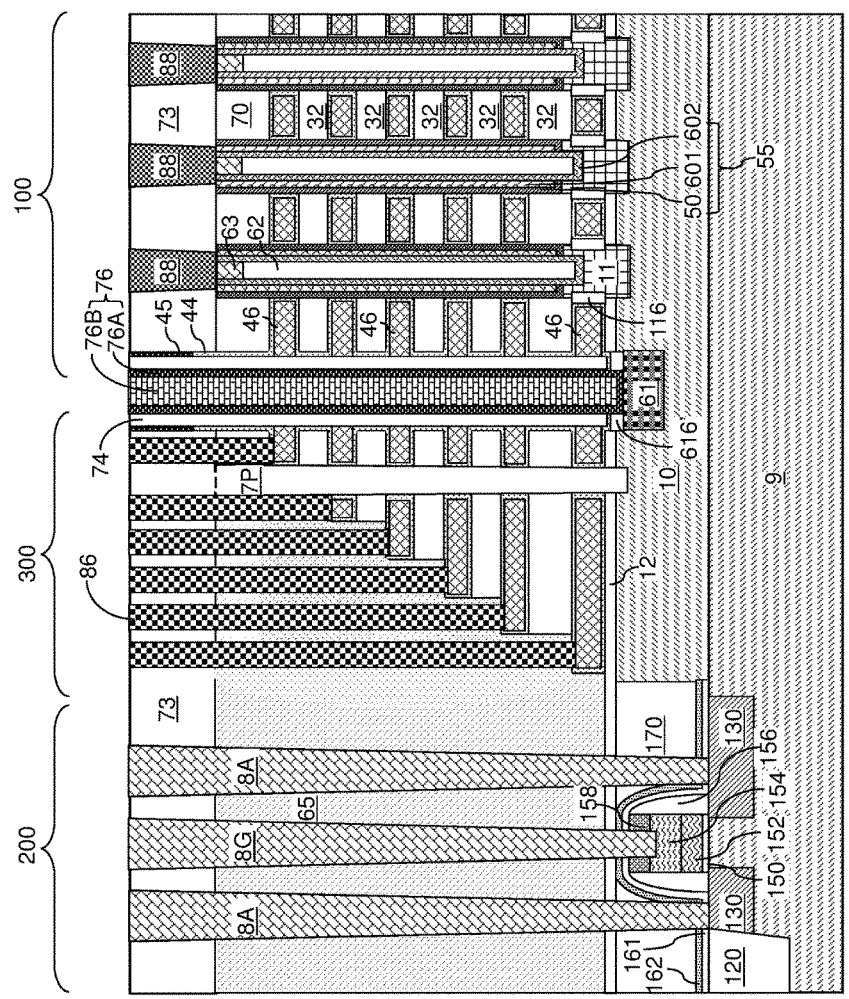
FIG. 21 is a vertical cross-sectional view of a modification of the second exemplary structure according to the second embodiment of the present disclosure.

Referring to FIG. 20, the processing steps of FIG. 13 can be subsequently performed to form various additional contact via structures (8A, 8G, 86, 88). At least a portion of the aluminum compound layer 45 may remain after the planarization process. Alternatively, the horizontal portion of the aluminum compound layer 45 above the contact level dielectric layer 73 may be removed during the planarization process (or in a preceding planarization process at the processing steps of FIG. 19). FIG. 21 shows a modification of the second exemplary structure in which the aluminum compound layer 45 is completely consumed by the end of the processing steps of FIG. 20.

The second exemplary structure includes a three-dimensional memory device, which comprises: an alternating stack of insulating layers 32 and electrically conductive layers 46 located over a substrate (9, 10); a trench 79 extending through the stack of alternating layers; an aluminum oxide backside blocking dielectric layer 144 including liner portions located between the electrically conductive layers 46 and the insulating layers 32 and a vertical portion located at a periphery of the trench 79; an annular aluminum compound portion (which is a vertical portion of the aluminum oxide liner 45) located at an upper portion of the trench 79 and comprising aluminum and a non-metallic element other than oxygen; and a contact via structure 76 located inside the vertical portion of the aluminum oxide backside blocking dielectric layer 144 and the annular aluminum compound portion 45 and contacting a portion of the substrate (9, 10).

In one embodiment, the annular aluminum compound portion can comprise a material selected from aluminum silicon oxide, aluminum nitride or oxynitride, and aluminum fluoride or oxyfluoride. In one embodiment, compositions of the aluminum oxide backside blocking dielectric layer 144 and the annular aluminum compound portion (the vertical portion of the aluminum compound liner 45) differ by presence or absence of the non-metallic element other than oxygen therein.

In one embodiment, a horizontal aluminum compound portion may be present (as illustrated in FIG. 20), which has the same composition as the annular aluminum compound portion and overlies the alternating stack. In one embodiment, at least one contact via structure (such as the word line contact via structures 86) can be provided, which can extend to the electrically conductive layers 46 and have a topmost surface within a same horizontal plane as a top surface of the horizontal aluminum compound portion (i.e., the horizontal portion of the aluminum compound layer 45) as illustrated in FIG. 20.

In one embodiment, a bottom surface of the annular aluminum compound portion can contact a top surface of the aluminum oxide backside blocking dielectric layer 144. In one embodiment, an insulating spacer 74 laterally surrounds the contact via structure 76, and is laterally surrounded by the vertical portion of the aluminum oxide backside blocking dielectric layer 144 and the annular aluminum compound portion. In one embodiment, the insulating spacer 74 can comprise a material selected from silicon oxide and silicon nitride. The aluminum oxide liner 75 may optionally be present over the spacer 74. Furthermore, the top part of the aluminum oxide liner 75 may be optionally doped with silicon, nitrogen or fluorine.

In one embodiment, the portion of the substrate (9, 10) that contacts the contact via structure 76 comprises a source region 61. The three-dimensional memory device can further comprise a plurality of memory stack structures 55 extending through the alternating stack. Each of the plurality of memory stack structures 55 can comprise a memory film 50 and a semiconductor channel 60 (e.g., 601, 602) that is laterally surrounded by the memory film 50.

Figure 22:
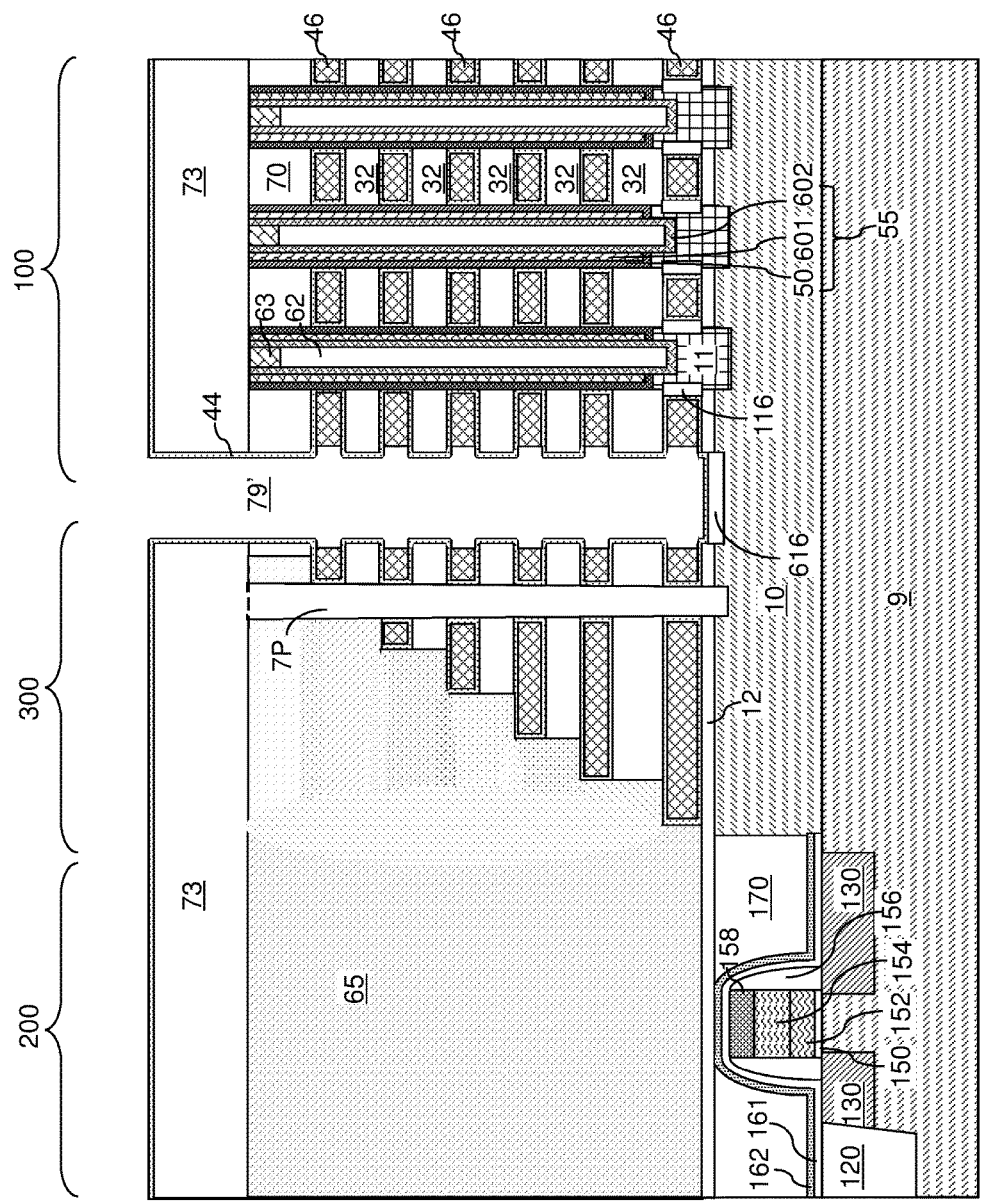
FIG. 22 is a vertical cross-sectional view of a third exemplary structure after forming electrically conductive layers according to a third embodiment of the present disclosure.

Referring to FIG. 22, a third exemplary structure can be derived from the first exemplary structure of FIG. 8. The sidewalls of the electrically conductive layers 46 can be substantially vertically coincident within inner sidewalls of the backside blocking dielectric layer 44 as illustrated in FIG. 8, or can be laterally recessed relative to vertical planes include the physically exposed inner sidewalls of the backside blocking dielectric layer 44 as illustrated in FIG. 22. Each sidewall of the electrically conductive layers 46 that is closer to any of the plurality of memory stack structures 55 than to the backside contact trench 79 is herein referred to as a proximal sidewall, and each sidewall of the electrically conductive layers that is closer to the backside contact trench 79 than to any of the plurality of memory stack structures 55 is herein referred to as a distal sidewall.

Figure 23:
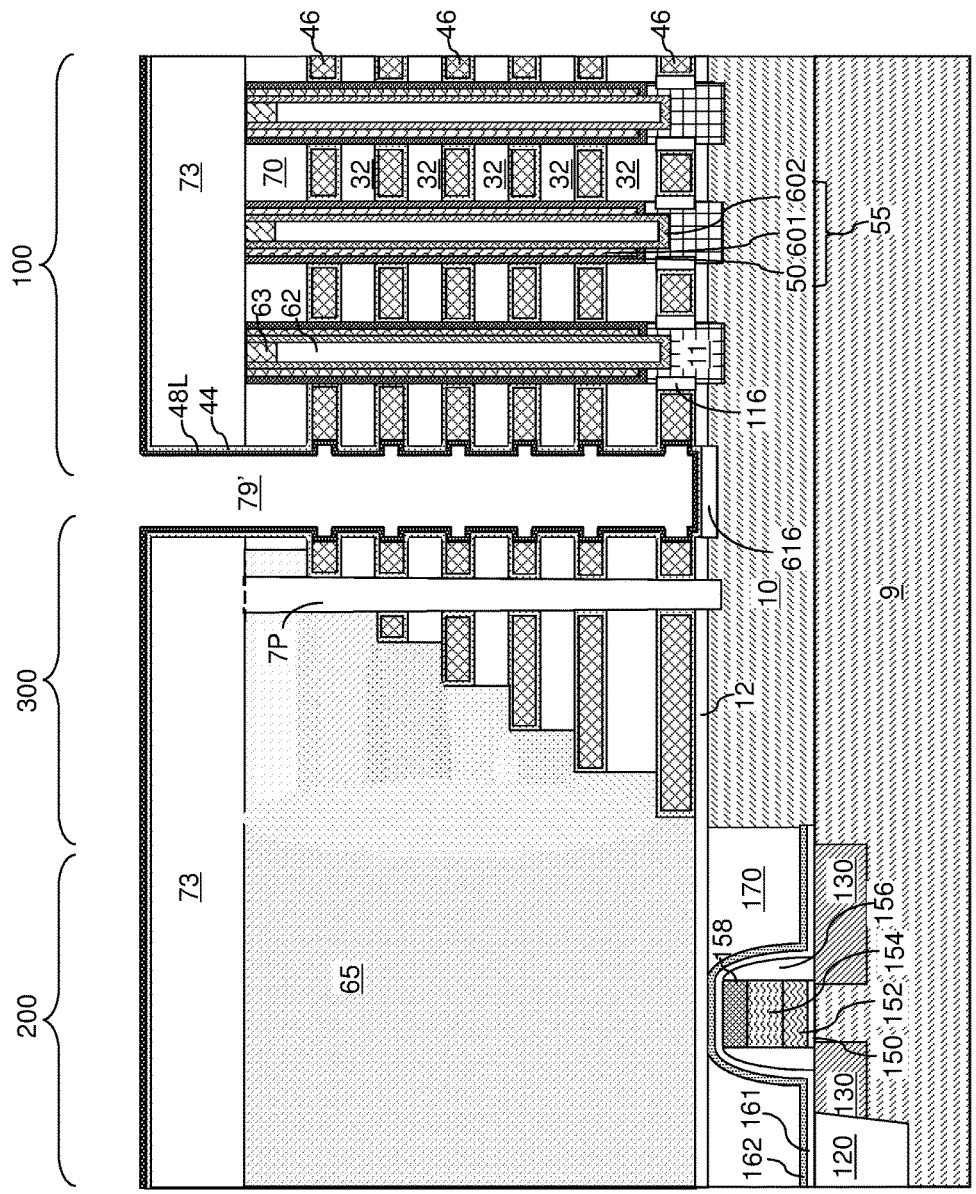
FIG. 23 is a vertical cross-sectional view of the third exemplary structure after deposition of an aluminum oxide liner according to the third embodiment of the present disclosure.

Referring to FIG. 23, an aluminum oxide liner layer 48L can be deposited on the physically exposed sidewalls of the backside blocking dielectric layer 44 (which are located at each level of the insulating layers 32) and on the distal sidewalls of the electrically conductive layers 46. A horizontal bottom portion of the aluminum oxide liner layer 48L can be formed directly on a horizontal bottom portion of the backside blocking dielectric layer 44 at the bottom of the backside contact trench 79. Another horizontal portion of the aluminum oxide liner layer 48L can be deposited directly on a top surface of another horizontal portion of the backside blocking dielectric layer 44 that overlies the contact level dielectric layer 73. The aluminum oxide liner layer 48L can be deposited employing a conformal deposition process such as atomic layer deposition. In one embodiment, the aluminum oxide liner layer 48L can include stoichiometric aluminum oxide ($Al_2O_3$) or non-stoichiometric aluminum oxide ($Al_2O_{3+\delta}$, $\delta>0$ or $\delta<0$). The thickness of the aluminum oxide liner layer 48L can be uniform throughout the entirety thereof, and can be in a range from 1 nm to 20 nm, although lesser and greater thicknesses can also be employed. A backside cavity 79' is present within the backside contact trench 79. If the distal sidewalls of the electrically conductive layers 46 are laterally recessed from the backside contact trench 79, the aluminum oxide liner layer 48L can include laterally protruding portions that protrude outward from the backside contact trench 79 at every level of the electrically conductive layers 46.

Figure 24:
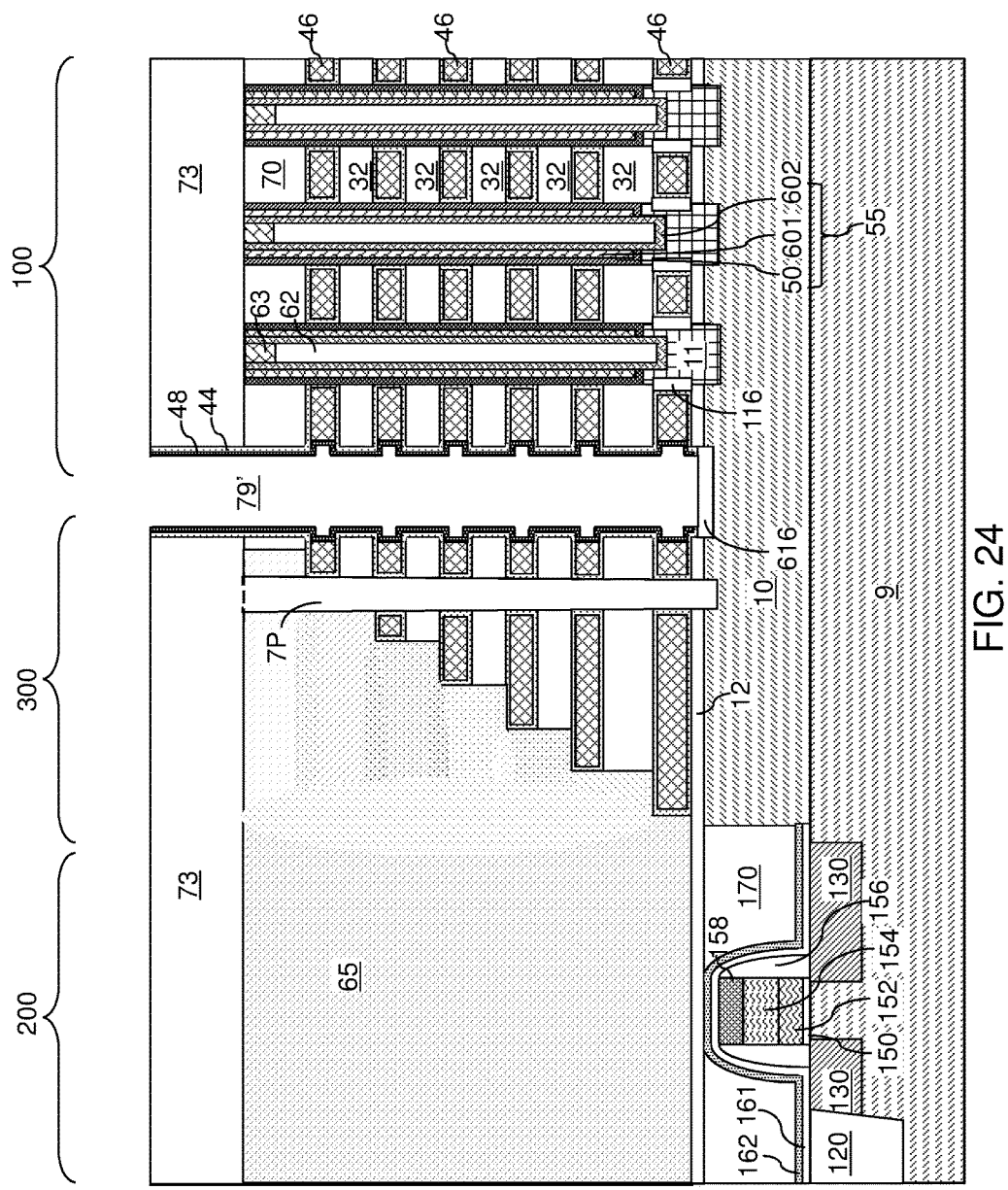
FIG. 24 is a vertical cross-sectional view of the third exemplary structure after an anisotropic etch that removes horizontal portions of the aluminum oxide liner and aluminum oxide backside blocking dielectric layer according to a third embodiment of the present disclosure.

Referring to FIG. 24, an anisotropic etch can be performed to remove horizontal portions of the aluminum oxide liner layer 48L and the backside blocking dielectric layer 44 from above the contact level dielectric layer 73 and from the bottom of the backside contact trench 79. The anisotropic etch can be a reactive ion etch, and may be selective to the dielectric material of the contact level dielectric layer 73. The remaining portion of the aluminum oxide liner layer 48L constitutes an aluminum oxide liner 48. In one embodiment, the aluminum oxide liner 48 can be topologically homeomorphic to a torus. The backside blocking dielectric layer 44 includes an opening that underlies a center portion of the backside contact trench 79.

Figure 25:
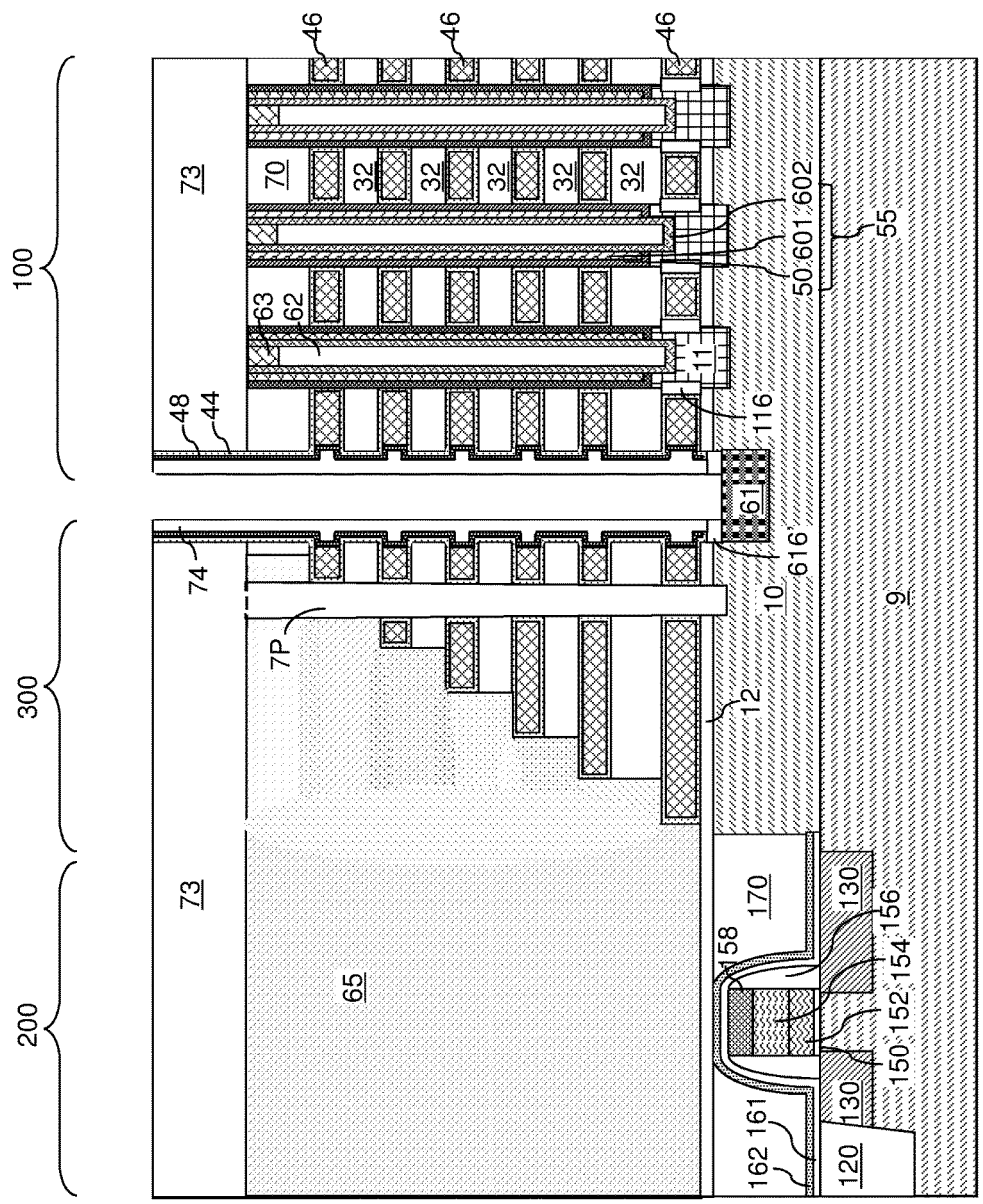
FIG. 25 is a vertical cross-sectional view of the third exemplary structure after formation of a backside contact structure according to the third embodiment of the present disclosure.

Referring to FIG. 25, an insulating material layer is deposited in the same manner as in the processing steps of FIG. 9. The insulating material layer can be formed by a conformal deposition process, and can include a dielectric material such as silicon oxide and/or silicon nitride. The insulating material layer is anisotropically etched to form an insulating spacer 74 on the inner sidewalls of the aluminum oxide liner 48. In case a sacrificial dielectric portion 616 is present at the bottom of the backside contact trench 79, the anisotropic etch is can remove a physically exposed center portion of the sacrificial dielectric portion 616 to physically expose an underlying semiconductor surface (such as a surface of the semiconductor material layer 10). The remaining portion of the sacrificial dielectric portion 616 constitutes an annular semiconductor oxide spacer 616'.

Subsequently, a source region 61 can be formed underneath each cavity 79', for example, by implantation of electrical dopants of the second conductivity type and an activation anneal. A contact via structure 76 can be formed within each cavity 79' employing the same processing steps as the processing steps of FIG. 12.

Figure 26:
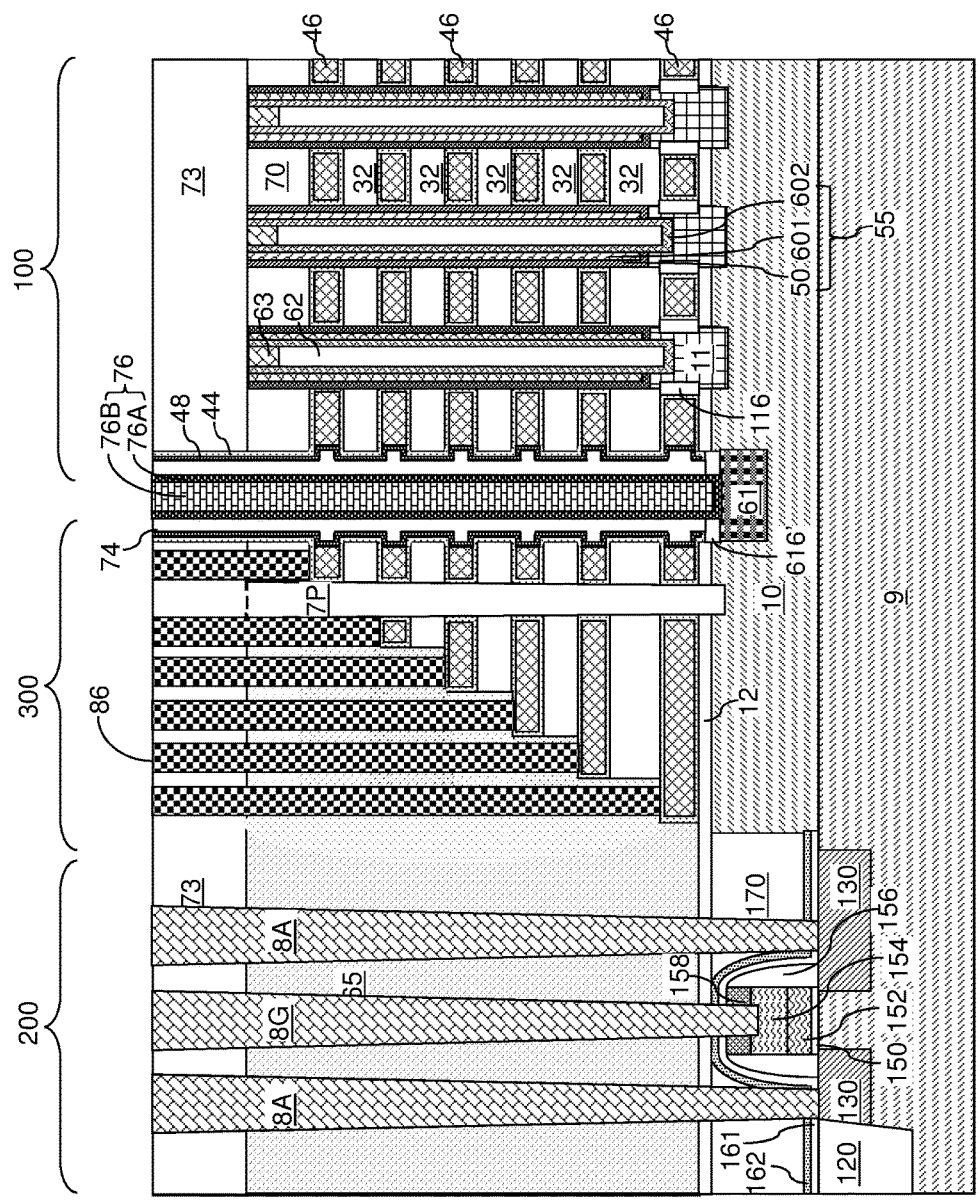
FIG. 26 is a vertical cross-sectional view of the third exemplary structure after formation of additional contact via structures according to the third embodiment of the present disclosure.

Referring to FIG. 26, the processing steps of FIG. 13 can be subsequently performed to form various additional contact via structures (8A, 8G, 86, 88).

The third exemplary structure can include a three-dimensional memory device, which includes an alternating stack of insulating layers 32 and electrically conductive layers 46 located over a substrate (9, 10); and a plurality of memory stack structures 55 extending through the alternating stack. Each of the plurality of memory stack structures 55 comprises a memory film 50 and a semiconductor channel 60 that is laterally surrounded by the memory film 50. The three-dimensional memory device further includes a trench 79 extending through the alternating stack; a backside blocking dielectric layer 44 located between the electrically conductive layers 46 and the plurality of memory stack structures 55, between each vertically neighboring pairs of an electrically conductive layer 46 and an insulating layer 32 in the alternating stack, and on a sidewall of the trench 79; an aluminum oxide liner 48 contacting portions of the backside blocking dielectric layer 44 overlying the sidewalls of the trench 79, and contacting sidewalls of the electrically conductive layers 46; an insulating spacer 74 comprising a dielectric material and located inside the aluminum oxide liner 48; and a contact via structure 76 located inside the insulating spacer 74 and contacting a portion of the substrate (9, 10).

In one embodiment, a proximal sidewall of each electrically conductive layer 46 that is more proximal to one of the plurality of memory stack structures 55 than to the trench 79 contacts a vertical portion of the backside blocking dielectric layer 44; and a distal sidewall of each electrically conductive layer 46 that is more proximal to the trench 79 than to the plurality of memory stack structures 55 contacts a vertical portion of the aluminum oxide liner 48.

In one embodiment, a top surface of the insulating spacer 74, a top surface of the aluminum oxide liner 48, and a top surface of the backside blocking dielectric layer 44 are within a same horizontal plane, which can be the horizontal plane including the top surface of the backside contact via structure 76.

In one embodiment, an annular semiconductor oxide spacer 616' can contact a bottommost surface of the backside blocking dielectric layer 44 and a surface of the substrate (9, 10).

Figure 27:
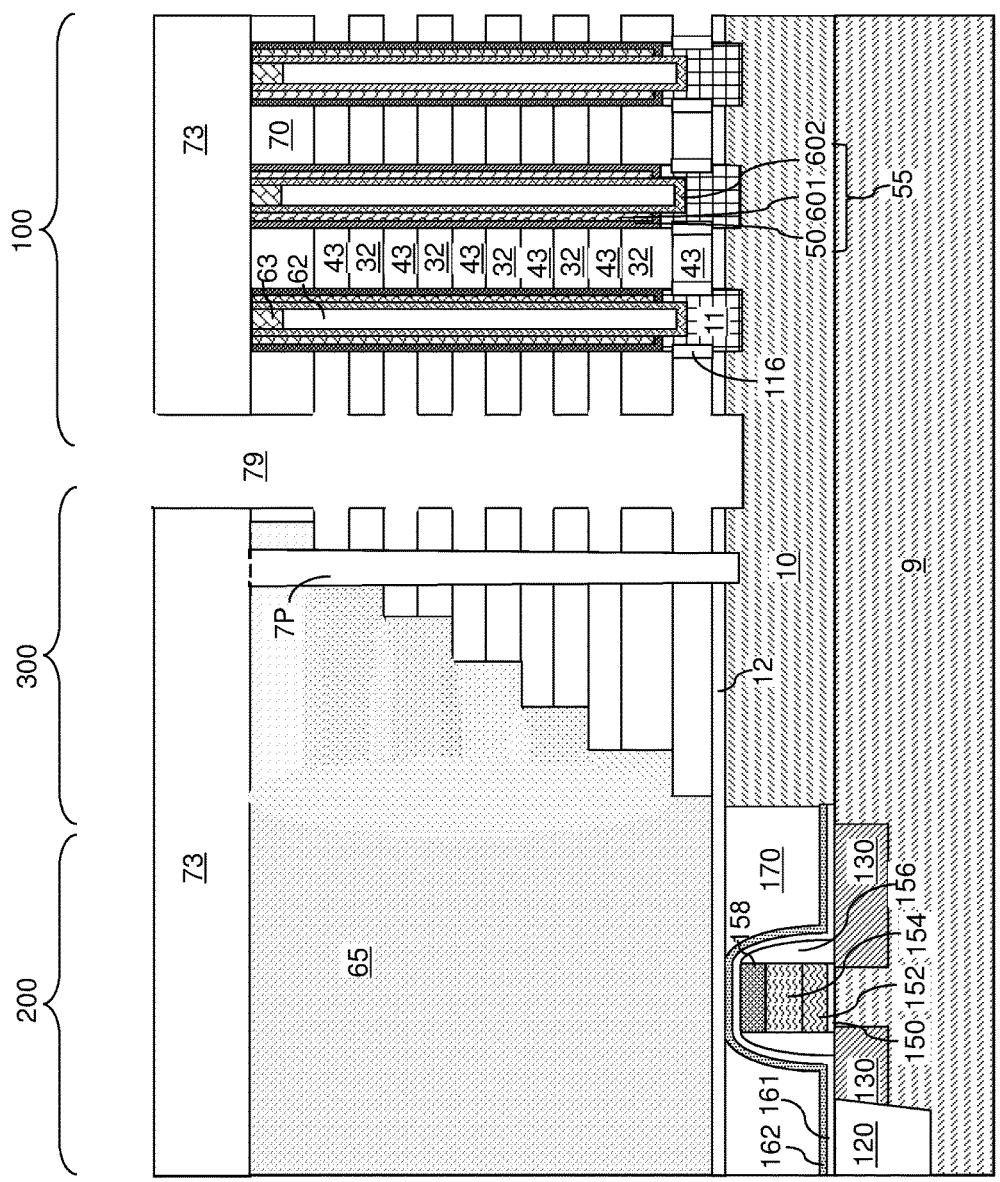
FIG. 27 is a vertical cross-sectional view of an alternate embodiment of the first, second, or third exemplary structure after formation of the aluminum oxide backside blocking dielectric layer.

Referring to FIG. 27, an alternative embodiment of a first, second, or third exemplary structure or modifications thereof is illustrated after formation of a backside blocking dielectric layer 44 (which can be an aluminum oxide backside blocking dielectric layer 144 in the case of the second embodiment). The alternative embodiment illustrated in FIG. 27 can be derived from the first exemplary structure of FIG. 6 by anisotropically etching the sacrificial dielectric portion 616 after the processing steps of FIG. 6. In addition, embodiments are expressly contemplated herein in which the dielectric spacers 116 are omitted. Such embodiments can be derived from the first exemplary structure of FIG. 6 by omitting formation of the dielectric spacers 116 and the sacrificial dielectric portion 616, and by forming the backside blocking dielectric layer 44 (or the aluminum oxide backside blocking dielectric layer 144) directly on the sidewalls of the epitaxial channel portions 11 and on the physically exposed top surface of semiconductor material layer 10.

Figure 28:
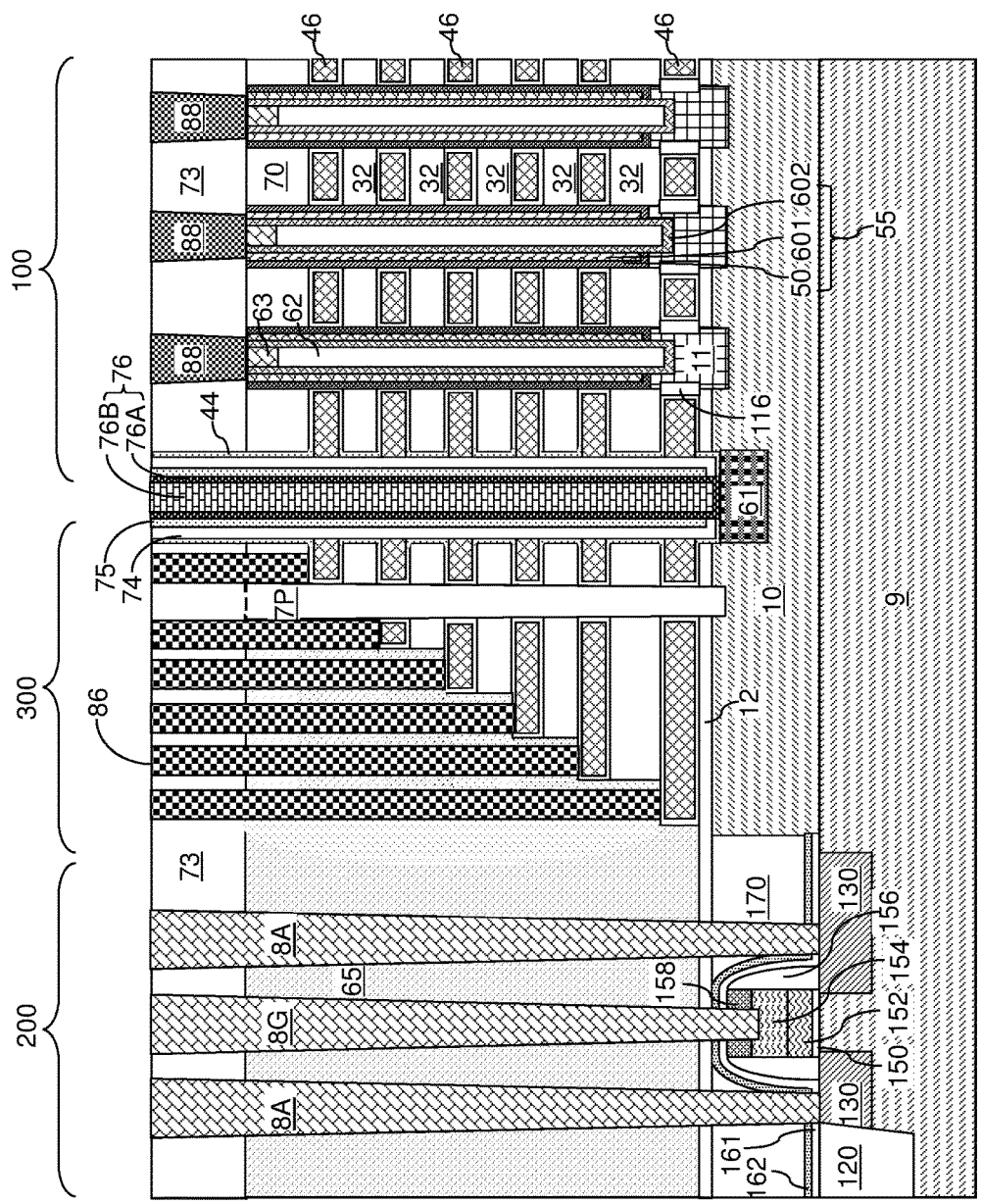
FIG. 28 is a vertical cross-sectional view of the alternate embodiment of the first exemplary structure after formation of additional contact via structures.

Referring to FIG. 28, an alternative embodiment of the first exemplary structure is illustrated, which can be formed by performing the processing steps of FIGS. 7-13 on the structure illustrated in FIG. 27. In this case, the backside blocking dielectric layer 44 contacts a semiconductor surface of the substrate (9, 10).

Figure 29:
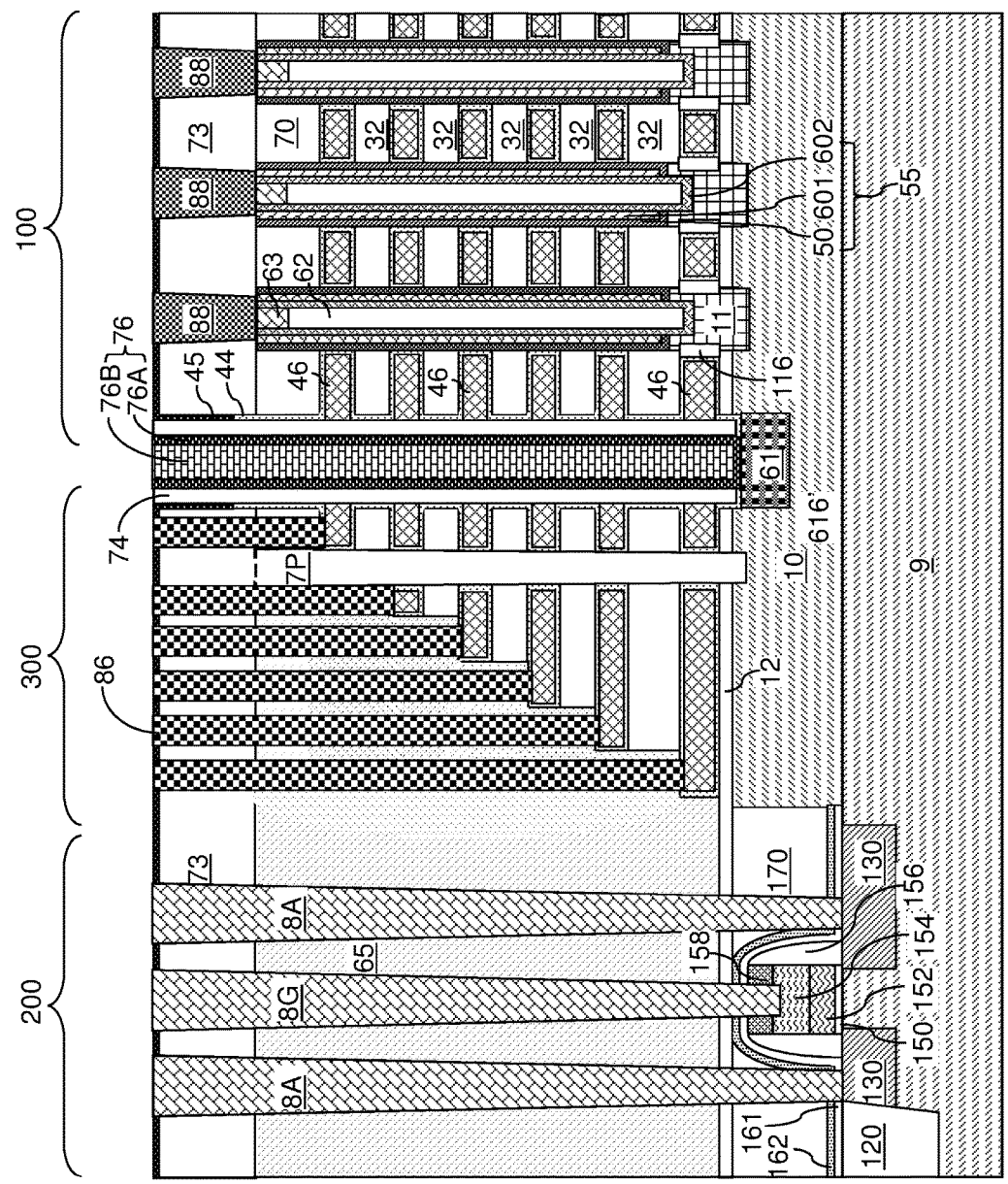
FIG. 29 is a vertical cross-sectional view of the alternate embodiment of the second exemplary structure after formation of additional contact via structures.

Referring to FIG. 29, an alternative embodiment of the second exemplary structure is illustrated, which can be formed by performing the processing steps of FIGS. 15-20 on the structure illustrated in FIG. 27. In this case, an aluminum oxide backside blocking dielectric layer 144 contact a semiconductor surface of the substrate (9, 10).

Figure 30:
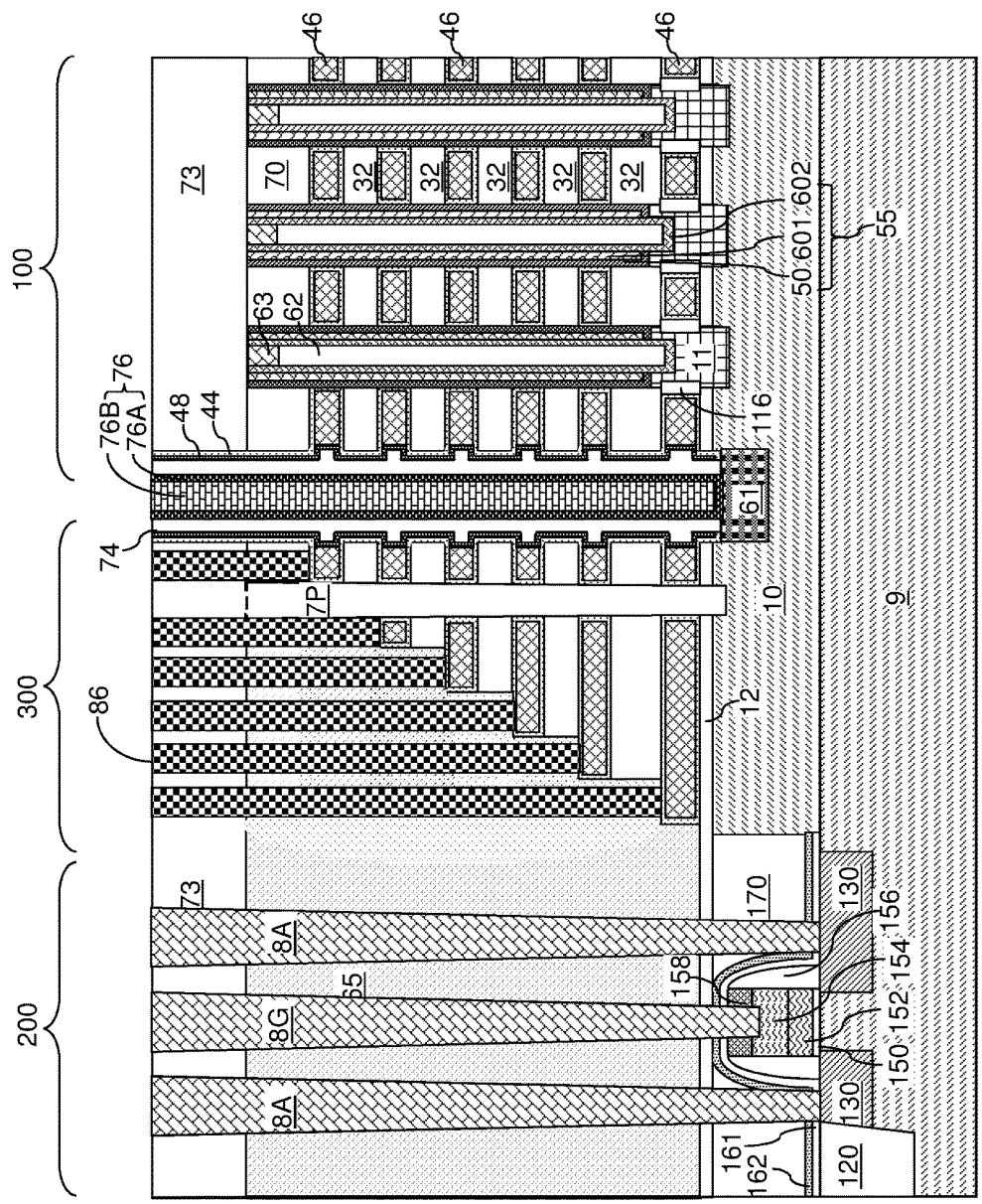
FIG. 30 is a vertical cross-sectional view of the alternate embodiment of the third exemplary structure after formation of additional contact via structures.

Referring to FIG. 30, an alternative embodiment of the third exemplary structure is illustrated, which can be formed by performing the processing steps of FIGS. 22-26 on the structure illustrated in FIG. 27. In this case, a backside blocking dielectric layer 44 contacts a semiconductor surface of the substrate (9, 10).

Each of the first, second, and third exemplary structures and alternate embodiments thereof can include a memory device such as a monolithic three-dimensional memory device. The monolithic three-dimensional memory device can comprise a vertical NAND device located over the substrate (9, 10), and the electrically conductive layers 46 can comprise, or are electrically connected to, a respective word line of the vertical NAND device. The substrate (9, 10) can comprise a silicon substrate. The vertical NAND device can comprise an array of monolithic three-dimensional NAND strings located over the silicon substrate. At least one memory cell in a first device level of the three-dimensional array of NAND strings is located over another memory cell in a second device level of the three-dimensional array of NAND string. The silicon substrate can contain an integrated circuit comprising a driver circuit for the memory device located thereon.

The array of monolithic three-dimensional NAND strings can comprise a plurality of semiconductor channels (601, 602). At least one end portion of each of the plurality of semiconductor channels (601, 602) extends substantially perpendicular to a top surface of the substrate (9, 10). In one embodiment, the plurality of semiconductor channels can be connected in a parallel connection to a common horizontal semiconductor channel portion that is a portion of the semiconductor material layer 10 between a source region 61 and the epitaxial channel portions 11, and the vertical semiconductor channels 60 that are portions of the memory stack structures 55. The array of monolithic three-dimensional NAND strings can comprise a plurality of charge storage elements (which can be embodied as sections of a charge storage layer 504 that is present within each memory stack structure 55). Each charge storage element can be located adjacent to a respective one of the plurality of semiconductor channels, i.e., adjacent to a respective vertical semiconductor channel (601, 602). The array of monolithic three-dimensional NAND strings can comprise a plurality of control gate electrodes having a strip shape extending substantially parallel to the top surface of the substrate (9, 10). The plurality of control gate electrodes comprise at least a first control gate electrode located in the first device level and a second control gate electrode located in the second device level.

The aluminum oxide liner (48/75) and/or the aluminum compound layer 45 of the embodiments of the present disclosure reduce or prevent the widening of the top of the trench 79 during the etching of the insulating spacer 74, and thus prevent or reduce short circuits between the drain contact via structure 88 and the contact via structure 76. Unwanted erosion of dielectric materials around a backside contact trench can be avoided or minimized employing an aluminum oxide liner. An aluminum oxide liner can be formed inside an insulating material layer in a backside contact trench to prevent collateral etching of the insulating material at an upper portion of the backside contact trench during an anisotropic etch that forms an insulating spacer. Alternatively or in addition, an aluminum oxide layer can be employed as a backside blocking dielectric layer. An upper portion of the aluminum oxide layer can be converted into an aluminum compound layer including aluminum and a non-metallic element other than oxygen at an upper portion of the trench, and can be employed as a protective layer during formation of a backside contact structure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   an alternating stack of insulating layers and electrically conductive layers located over a substrate;
   a trench extending through the alternating stack;
   an aluminum oxide backside blocking dielectric layer including liner portions located between the electrically conductive layers and the insulating layers and a vertical portion located at a periphery of the trench;
   an annular aluminum compound portion located at an upper portion of the trench and comprising aluminum and a non-metallic element other than oxygen; and
   a contact via structure located inside the vertical portion of the aluminum oxide backside blocking dielectric layer and the annular aluminum compound portion and contacting a portion of the substrate.

2. The three-dimensional memory device of claim 1, wherein the annular aluminum compound portion comprises a material selected from aluminum silicon oxide, aluminum nitride, aluminum oxynitride, aluminum oxyfluoride and aluminum fluoride.

3. The three-dimensional memory device of claim 1, wherein a composition of the annular aluminum compound portion differs from a composition of the aluminum oxide backside blocking dielectric layer by a presence of the non-metallic element other than oxygen therein.

4. The three-dimensional memory device of claim 1, further comprising a horizontal aluminum compound portion having a same composition as the annular aluminum compound portion and overlying the alternating stack.

5. The three-dimensional memory device of claim 4, further comprising at least one contact via structure extending to the electrically conductive layers and having a topmost surface within a same horizontal plane as a top surface of the horizontal aluminum compound portion.

6. The three-dimensional memory device of claim 1, wherein a bottom surface of the annular aluminum compound portion contacts a top surface of the aluminum oxide backside blocking dielectric layer.

7. The three-dimensional memory device of claim 1, further comprising an insulating spacer laterally surrounding the contact via structure, and laterally surrounded by the vertical portion of the aluminum oxide backside blocking dielectric layer and the annular aluminum compound portion.

8. The three-dimensional memory device of claim 7, wherein the insulating spacer comprises a material selected from silicon oxide and silicon nitride.

9. The three-dimensional memory device of claim 1, wherein the portion of the substrate that contacts the contact via structure comprises a source region.

10. The three-dimensional memory device of claim 1, further comprising a plurality of memory stack structures extending through the alternating stack, wherein each of the plurality of memory stack structures comprises a memory film and a semiconductor channel that is laterally surrounded by the memory film.

11. The three-dimensional memory device of claim 1, wherein:
   the three-dimensional memory device comprises a vertical NAND device located over the substrate;
   the electrically conductive layers comprise, or are electrically connected to, a respective word line of the NAND device;
   the substrate comprises a silicon substrate;
   the vertical NAND device comprises an array of monolithic three-dimensional NAND strings over the silicon substrate;
   at least one memory cell in a first device level of the array of monolithic three-dimensional NAND strings is located over another memory cell in a second device level of the array of monolithic three-dimensional NAND strings;
   the silicon substrate contains an integrated circuit comprising a driver circuit for the memory device located thereon; and the array of monolithic three-dimensional NAND strings comprises:
- a plurality of semiconductor channels, wherein at least one end portion of each of the plurality of semiconductor channels extends substantially perpendicular to a top surface of the substrate;
- a plurality of charge storage elements, each charge storage element located adjacent to a respective one of the plurality of semiconductor channels; and
- a plurality of control gate electrodes having a strip shape extending substantially parallel to the top surface of the substrate, the plurality of control gate electrodes comprise at least a first control gate electrode located in the first device level and a second control gate electrode located in the second device level.

* * * * *